United States Patent [19]
Hirama et al.

[11] Patent Number: 5,378,875
[45] Date of Patent: Jan. 3, 1995

[54] MICROWAVE OVEN WITH POWER DETECTING DEVICE

[75] Inventors: Masahiro Hirama; Masami Koshimura; Sakae Mori; Jiro Yoshida, all of Saitama, Japan

[73] Assignee: Mitsubishi Materials Corporation, Tokyo, Japan

[21] Appl. No.: 989,173

[22] Filed: Dec. 11, 1992

[30] Foreign Application Priority Data

| Dec. 25, 1991 | [JP] | Japan | 3-357057 |
| Dec. 25, 1991 | [JP] | Japan | 3-357058 |
| Mar. 26, 1992 | [JP] | Japan | 4-100348 |
| Mar. 26, 1992 | [JP] | Japan | 4-100349 |
| Mar. 26, 1992 | [JP] | Japan | 4-100350 |
| May 29, 1992 | [JP] | Japan | 4-163582 |
| Jul. 6, 1992 | [JP] | Japan | 4-202037 |
| Jul. 6, 1992 | [JP] | Japan | 4-202038 |
| Oct. 23, 1992 | [JP] | Japan | 4-309514 |

[51] Int. Cl.$^6$ ............................................. H05B 6/68
[52] U.S. Cl. ................................. 219/705; 219/710; 219/709
[58] Field of Search ............... 219/705, 709, 710, 712, 219/713; 324/637

[56] References Cited

U.S. PATENT DOCUMENTS

| 4,009,359 | 2/1977 | Tallmadge et al. | 219/705 |
| 4,447,693 | 5/1984 | Buck | 219/705 |
| 4,632,127 | 12/1986 | Sterzer | 219/705 X |
| 4,816,634 | 3/1989 | Lentz et al. | 219/705 |
| 4,871,891 | 10/1989 | Steers et al. | 219/710 |

*Primary Examiner*—Philip H. Leung
*Attorney, Agent, or Firm*—McAulay Fisher Nissen Goldberg & Kiel

[57] ABSTRACT

A microwave oven has only a microwave sensor or both microwave sensor and temperature sensor. The microwave sensor has a wave absorber to generate heat through absorption of microwave energy and a thermistor to detect temperature of this wave absorber. The temperature sensor has a thermistor to detect the ambient temperature around the wave absorber. A controller determines a value of microwave power on the basis of the output of the microwave sensor or each output of the microwave sensor and temperature sensor. The microwave oven can accurately detect microwave power without being influenced by variation of ambient temperature around the microwave sensor.

11 Claims, 15 Drawing Sheets

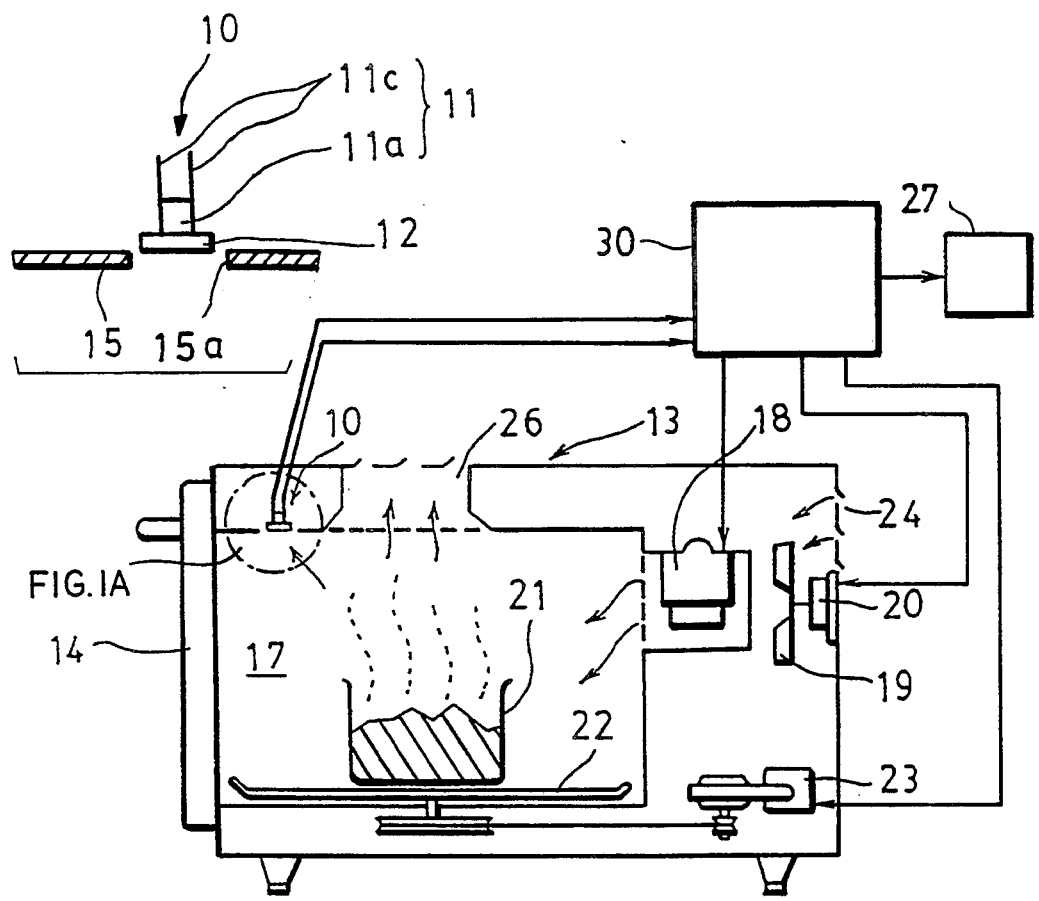
FIG.1A
FIG.1
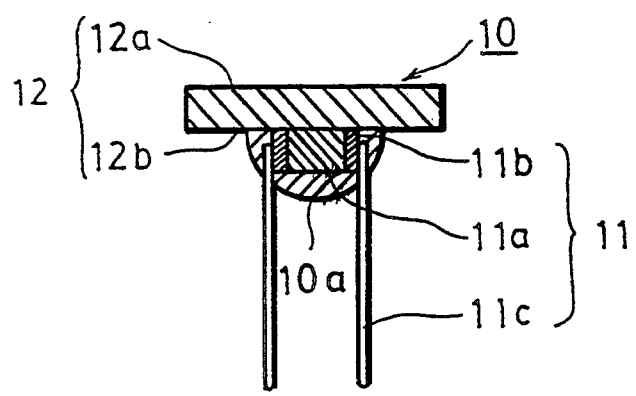
FIG.2

MICROWAVE OVEN WITH POWER DETECTING DEVICE

BACKGROUND OF THE INVENTION

1. Field of the Invention

The present invention relates to a microwave oven having a microwave sensor suitable for detecting a heating state or finishing state of a heated object the microwave oven.

2. Description of the Related Art

A microwave oven provides various functions such as thawing frozen food, warming chilled food, and the like by means of microwave heating. A microwave oven automatically controls the output of its magnetron to generate microwave energy by detecting with a sensor a heating state or a finishing state of such food.

A microwave oven which traces variation of temperature of the heated food from its frozen state to a thawed state and detects the end of a thawing cycle has been disclosed (Unexamined Published Japanese Patent application No. 64-50385). This microwave oven is equipped with a detector generating heat by absorbing microwave energy, a device to measure the temperature, and a computing and controlling device to control operation of the microwave oven from the temperature. The detector is located near an object to be processed in the microwave oven, and the computing and controlling device utilizes a curve showing temperature rise of the detector as a function of time, determines the end of a thawing cycle of the object by computing the value of a quadratic derivative (i.e., a derivative of the second degree) of this curve, and controls operation of the microwave oven at the end of the thawing cycle in which the value of the derivative of the second order is less than a specified value.

Another microwave oven equipped with a detector which can detect at a certain sensitivity the end of each thawing operation in a plurality of sequential thawing operations has also been disclosed (Unexamined Published Japanese Patent Application No. 64-50384). This microwave oven is also equipped with a microwave detector, a temperature measuring device, and a computing and controlling device. The detector of this microwave oven has a heat insulator which transmits microwave energy but prevents heat of the detector, which has been generated by absorbing microwave energy, from radiating outside. Since the heat insulator increases the temperature rise of the detector through reduction of heat exchange with the outside environment, the detector can monitor and detect each thawing operation without lowering its sensitivity. The heat exchange area of this detector is wide and is thin in thickness. This facilitates exchanging of heat by the detector with the outside environment and brings about a short thermal lag characteristic so as to quickly recover the initial characteristics after each thawing operation.

In the microwave oven described in Unexamined Published Japanese Patent Application NO. 64-50385, as an object proceeds from the icy state to the watery state, it is gradually heated by gradually absorbing more and more microwave energy, and the power absorbed by the detector gradually decreases.

When the slope (the linear derivative, i.e., the derivative of the first degree) of the curve representing temperature rise of the detector as a function of time is measured and the slope decreases to some degree and the absolute value of the quadratic derivative of the curve becomes greater than a specified value, the object in the microwave oven begins to thaw. When this slope becomes shallow and the absolute value of the derivative of the second degree of the curve becomes less than the specified value, the object has finished thawing. The above-mentioned microwave oven determines the thawing state from such variation of the quadratic derivative.

According to this method of determining a thawing state, however, it must be only the variation of the microwave power absorbed by the detector that causes the derivative of the second degree to change.

In general, t hours after a heated object, for example, a microwave sensor having heat capacity C has been receiving microwave power P, its temperature rise value $\Theta$ is represented by the following expression (2) in a completely adiabatic state in which no heat radiates outside at all. This relation is shown in FIG. 26.

$$\Theta = P \cdot t / c \qquad (2)$$

In an actual heated object, however, heat radiated outside cannot be ignored when it receives microwave power. If the heated object has a heat radiation constant $\delta$, the work P·dt which the object receives for a very short time dt is represented by the following expression (3).

$$P \cdot dt = C \cdot d\Theta + \delta \cdot \Theta \cdot dt \qquad (3)$$

where $d\Theta$ is the temperature rise of the object during a very short time, $C \cdot d\Theta$ is a heat energy stored in the object during a very short time, and $\delta \cdot \Theta$ dt is a heat energy radiated outside during a very short time. From the above-mentioned expression (3), the temperature rise value $\Theta$ of the object is represented by the following expression (4) when the electric power P is constant. This relation is shown in FIG. 27.

$$\Theta = (P/\delta) \cdot [1 - exp(-t/\tau)] \qquad (4)$$

In this expression, $\tau$ is a thermal time constant ant has a relation of $C = \tau \cdot \delta$. As seen in FIGS. 26 and 27, the difference grows between the temperature rise rates in the two cases as the temperature rise value $\Theta$ becomes larger.

Finding the linear derivative ($d\Theta/dt$) and the quadratic derivative ($d^2\Theta/dt^2$) described in Unexamined Published Japanese Patent Application No. 64-50385 from the above-mentioned expression (4) results in the following expressions (5) and (6), respectively. These relations are shown in FIGS. 28 and 29.

$$d\Theta/dt = (P/\delta/\tau) \cdot exp(-t/\tau) \qquad (5)$$

$$d^2\Theta/dt^2 = (-P/\delta/\tau^2) \cdot exp(-t/\tau) \qquad (6)$$

FIG. 29 and expression (6) show that the quadratic derivative ($d^2\Theta/dt^2$) varies from $(-P/\delta/\tau^2)$ to 0 in a range of time from zero to infinity $(0 - \infty)$ and is caused to change by heat radiation even when-the electric power does not vary with time.

This suggests that the method of determining a thawing state in the microwave oven described in Unexamined Published Japanese Patent Application No. 64-50385 is not accurate in a state in which the value e of temperature rise has increased. That is, the above-mentioned microwave oven determines the thawing state referring to variation of the quadratic derivative only from the variation of the microwave power absorbed by the detector, however, actually it is necessary to consider heat radiation of the microwave sensor.

The microwave oven shown in Unexamined Published Japanese Patent Application No. 64-50384 as described above, uses a heat insulator and adopts structure easy to radiate heat. As a result, (1) the heat insulator reduces heat radiation when microwave energy is irradiated, and (2) when microwave energy is not applied, the structure, which easily radiates heat, increases heat radiation and quickly returns the detector to the initial state, and further, prevents heat destruction caused by heat accumulation in the case of repeated heating.

However, the above-mentioned factors (1) and (2) are contradictory to each other, and it is impossible to full satisfy each of them.

In the case of considering heat radiation outside of the detector, the heat energy to be radiated depends on the ambient temperature. That is, when the ambient temperature is high, less heat energy is radiated, and when it is low, greater heat energy is radiated. For example, according to a condition of using a microwave oven, detection error becomes great when the temperature of the heating chamber is high. Since a single detector according to the prior art uniformly absorbs the ambient temperature, the microwave oven has been unable to accurately detect microwave power.

SUMMARY OF THE INVENTION

It is an object of the invention to provide a device which does not always require reduction of heat radiation of the microwave sensor and can accurately detect microwave power in consideration of this heat radiation.

It is another object of the invention to provide a device which can accurately detect microwave power without being influenced by variation of the ambient temperature around the microwave sensor.

The first microwave oven of the present invention comprises a microwave sensor having a wave absorber which generates heat through absorption of microwave energy and a thermistor detecting temperature of the above-mentioned absorber, and a computing device which computes the value of the microwave power on the basis of the output of the microwave sensor; and the computing device computes value of the microwave power as a function of time, using the following expression (1), $$P = C \cdot d\Theta/dt + \delta \cdot \Theta \quad (1)$$

Where P is the microwave power absorbed by the wave absorber, $\Theta$ is a value of temperature rise detected by the thermistor, C is the heat capacity of the microwave sensor, and $\delta$ is a thermal radiation constant of the microwave sensor.

The second microwave oven comprises a microwave sensor having a wave absorber to generate heat through absorption of microwave energy and the first thermistor to detect temperature of the absorber; a temperature sensor having the second thermistor to detect the ambient temperature of the wave absorber; and a computing device which computes the value of the microwave power on the basis of each output of the microwave sensor and temperature sensor; and the computing device computes the value of the microwave power as a function of time, using the following expression (1), $$P = C \cdot d\Theta/dt + \delta \cdot \Theta \quad (1)$$

Where P is the microwave power absorbed by the wave absorber, $\Theta = \Theta_1 - \Theta_2$, where $\Theta_1$ is a value of temperature rise detected by the first thermistor and $\Theta_2$ is a value of temperature rise detected by the second thermistor, C is the heat capacity of the microwave sensor, and $\delta$ is a thermal radiation constant of the microwave sensor.

In the second microwave oven, the wave absorber may be fitted in a fitting opening provided on a metal wall forming a microwave heating chamber by way of a first metal member so that one face of the wave absorber may face inside of the heating chamber; the temperature sensing part of the first thermistor may be adhered to another face of the wave absorber so as not to receive microwave energy; and the second thermistor may be fitted on the back face of the metal wall by way of a second metal member.

In the second microwave oven, the temperature sensor may have a wave reflector which has the same shape, size, and heat capacity as the wave absorber, and a second thermistor which detects temperature of the reflector and has the same structure as the first thermistor.

In the first microwave oven, the microwave sensor may have the wave absorber which is formed in the shape of a flat plate having wider area, at least, than a temperature sensing part of the thermistor, with one face being a microwave absorbing face and the temperature sensing part of the thermistor is adhered to another face so as not to receive microwave energy.

The above-mentioned expression (1) is obtained by dividing both sides of the above-mentioned expression (3) by dt. Using this expression (1), microwave power P with respect to time can be obtained from heat capacity C of the sensor, heat radiation constant $\delta$, value of temperature rise $\Theta$ to time, and its rate of change $d\Theta/dt$.

And by dividing a value of the microwave power P by a microwave receiving area of the microwave sensor, irradiation power per unit area can be obtained.

For a better understanding of the present invention, reference is made to the following description and accompanying drawings while the scope of the invention will be pointed out in the appended claims.

BRIEF DESCRIPTION OF THE DRAWINGS

FIG. 1 is a structural illustration of a microwave oven of the first embodiment of the invention.

FIG. 2 is a cross-sectional view of a microwave sensor of the first microwave power detecting device.

DESCRIPTION OF THE PREFERRED EMBODIMENTS

Figure 3:
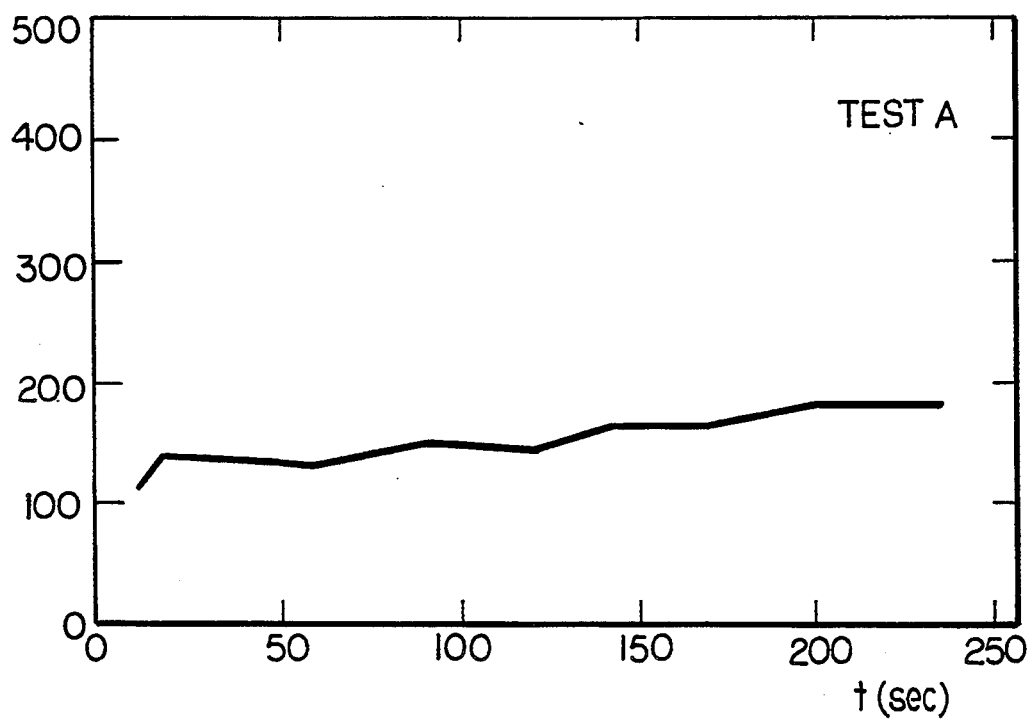
FIG. 3 is a graph showing variation of electric power detected by the first power detecting device when no object to be heated exists.

The first embodiment of the present invention is described in detail on the basis of FIGS. 1 and 2. In the drawings, the same parts are denoted with the same reference numbers.

A door 14 is fitted on the front face of a microwave oven 13 so that the door 14 may be opened and closed. A microwave sensor 10 is fitted on the ceiling of the heating chamber 17 of the microwave oven 13. In this microwave sensor 10, a temperature sensing part 11a of a thermistor 11 is adhered to a flat-shaped wave absorber 12. The microwave sensor 10 is fixed in a fitting opening 15a formed in the frame 15 of the ceiling part so as to face the heating chamber 17. Lead wires 11c of the sensor 10 are set at a location where they are not irradiated with microwave energy from the magnetron 18 which is the microwave source.

The thermistor 11 is a MELF (Metal Electrode Face) type device of 1.35 mm in diameter and 1.45 mm in thickness, has the temperature sensing part 11a made of sintered metal oxide comprising Mn, Co, and Ni as its main ingredients, and is formed by soldering lead wires 11c onto terminal electrodes 11b of both ends of the temperature sensing part 11a. Resistance of the thermistor 11 at 25° C. is 100 kΩ and its B constant is 3965 K.

The wave absorber 12 of sintered SiC is 12 mm in diameter and 1 mm in thickness. One face 12a of the wave absorber 12 is a microwave absorbing face. The temperature sensing part 11a of the thermistor 11 with leads is adhered to the central part of the other face 12b of the wave absorber 12 using epoxy resin 10a. Heat radiation constant δ of the microwave sensor 10 including the thermistor 11, wave absorber 12 and epoxy resin 10a is 6 mW/° C. and its thermal time constant τ is 40 seconds.

A magnetron 18 to generate microwave energy of 2450 MHz is fitted into the inner part of the heating chamber 17, and a blower fan 19 and fan motor 20 are fitted at the back of the inner part of the chamber 17. A turning table 22 having a container 21 thereon, turned by a motor 23 is fitted to the bottom of the heating chamber 17. An intake 24 is provided near the fan motor 20, and an outlet 26 is provided in the ceiling part of the heating chamber 17.

A computing device, for example a controller 30 comprising a CPU and memory is provided in the microwave oven 13. This memory stores the relation of the above-mentioned expression (1), and each value of the heat radiation constant τ and thermal time constant τ. Output of the microwave sensor 10 is connected to the controller 30, and the value Θ of temperature rise caused by heat generation of the wave absorber 12 is entered into the controller 30 as an electric signal of the thermistor 11. Each output of the controller 30 is connected to the magnetron 18, motors 20 and 23, respectively.

In the microwave oven arranged in such a manner, the relation of expression (1), and each value of the heat capacity C and heat radiation constant δ which are specific to the microwave sensor 10 are stored in the controller 30 in advance.

When microwave energy reaches the microwave sensor 10, the wave absorber 12 generates heat by absorbing this microwave energy. The value Θ of temperature rise caused by this heat generation is entered into the controller 30. The controller 30 computes the expression (1) with this entered value Θ to accurately find the microwave power received by a heated object considering heat radiation of the microwave sensor.

As described below, microwave power detection tests were made, using the microwave oven composed in such a manner. The microwave output was set as "Weak" corresponding to 200 W. A recording device 27 was connected with the controller 30 in order to examine the microwave power irradiated inside of the heating chamber 17.

TEST A

First, in the state where nothing was put on the turning table 22, microwave energy was irradiated inside of the heating chamber 17 from the magnetron 18 controlled by the controller 30. Electric power computed by the controller 30 was recorded on the recording device 27 with the lapse of irradiation time. The result is shown in FIG. 3. In this case, since there was no heated object on the turning table 22, the electric power incident on the microwave sensor was almost constant with respect to time.

TEST B

Next, ice weighing 100 g was put in the container 21 on the turning table 22, and then microwave energy was irradiated inside of the heating chamber 17 in the same manner as in Test A. In this case, electric power incident upon the microwave sensor 10 was expected to decrease as the ice melted. As a result of recording the electric power computed by the controller 30 in the same manner as in Test A, the electric power was found to decrease at the time of about 200 seconds as shown in FIG. 4, and that expectation proved to be reasonable.

From the results of Tests A and B, the microwave sensor 10 of this embodiment has proved to be accurately responding to incident electric power.

Figure 4:
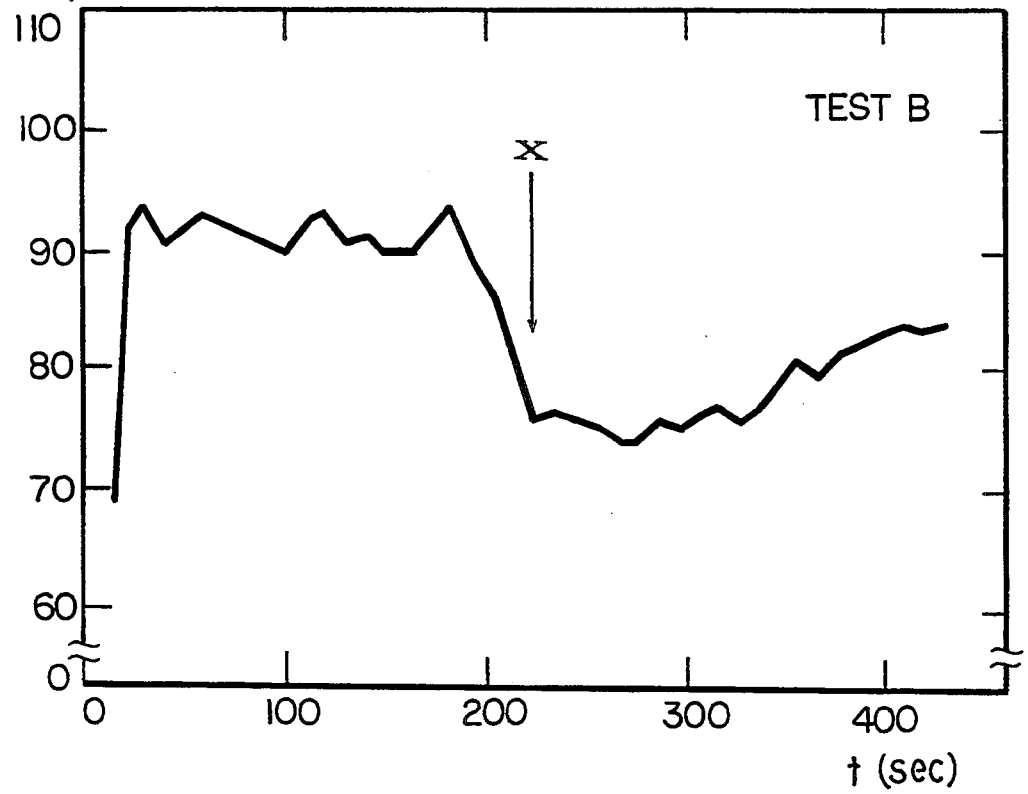
FIG. 4 is a graph showing variation of electric power detected by the first power detecting device when thawing ice.

If the point of time shown as X in FIG. 4 is set as the end of a thawing process when the electric power reaches the minimum and microwave output of the magnetron 18 is controlled when the controller 30 has found this point, then an end of thawing can be detected.

Figure 5A:
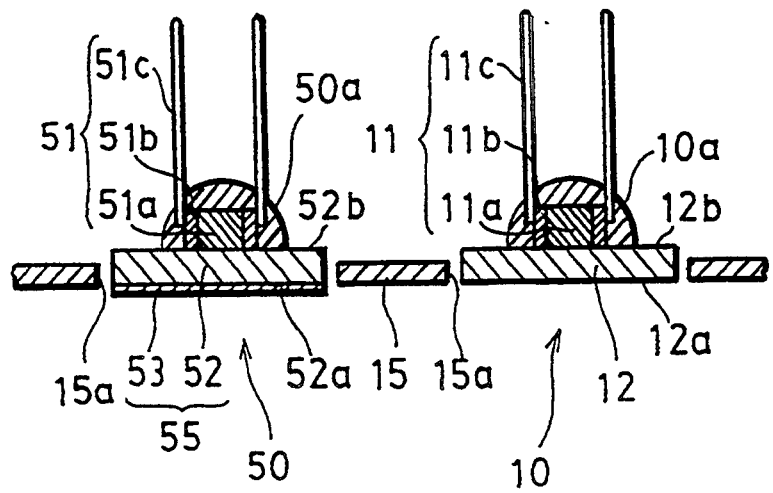
FIG. 5 is a structural illustration of a microwave oven of the second embodiment of the invention.
Figure 5:
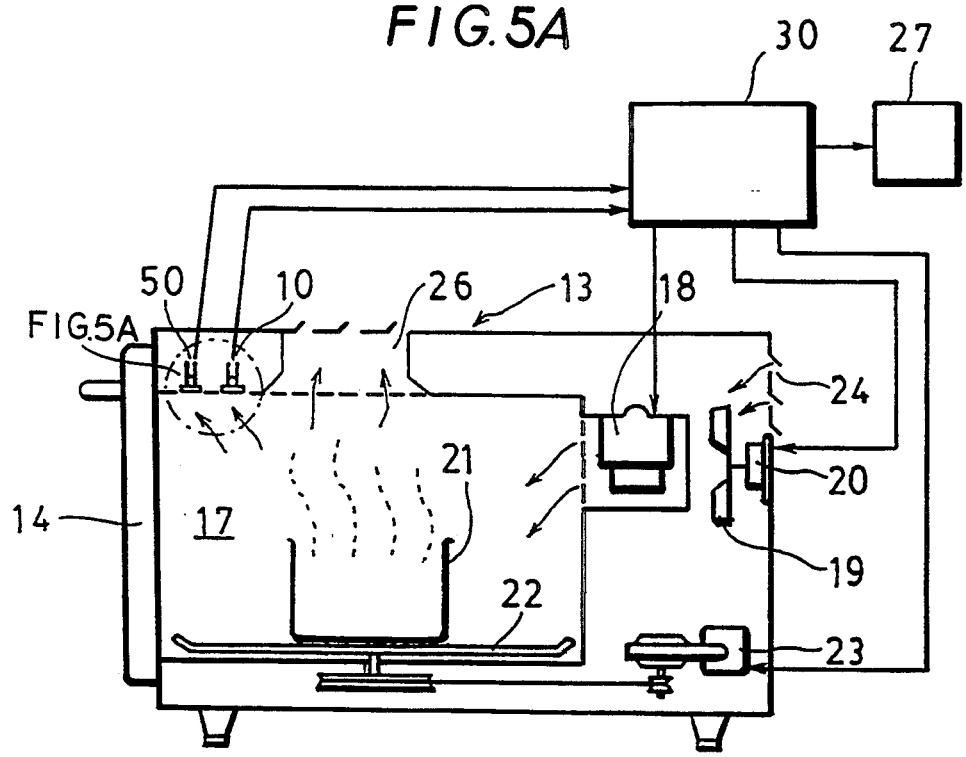

Next, the second embodiment of the invention is described in detail on the basis of FIG. 5.

A door 14 is fitted on the front face of the microwave oven 13 so that the door 14 may be opened and closed. A microwave sensor 10 and temperature sensor 50 are fitted in parallel on the ceiling part of the heating chamber 17 of the microwave oven 13. Both sensors 10 and 50 are fixed respectively in fitting holes 15$a$ and 15$a$ formed in the frame 15 of the ceiling so as to face inside the heating chamber 17, and lead wires 11$c$ and 51$c$ of both sensors 10 and 50 are set at a location where they are not irradiated by microwave energy from the magnetron 18, as described later.

Thermistors 11 and 51 are respectively a MELF (Metal Electrode Face) type device of 1.35 mm in diameter and 1.45 mm in thickness, have temperature sensing parts 11$a$ and 51$a$ made of sintered metal oxide comprising Mn, Co, and Ni as the main ingredients, and are formed by soldering the lead wires 11$c$ and 51$c$ respectively onto terminal electrodes 11$b$ and 51$b$ of both ends of the temperature sensing parts 11$a$ and 51$a$. Resistance values of both thermistors 11 and 51 at 25° C. are respectively 100 KΩ and their B constants are 3965 K, respectively.

Wave absorbers 12 and 52 of sintered SiC are respectively 12 mm in diameter and 1 mm in thickness, and have the same heat capacity, respectively. One side faces 12$a$ and 52$a$ of the wave absorbers 12 and 52 are microwave absorbing faces, and, to their central parts of the other side faces 12$b$ and 52$b$ respectively, are adhered the temperature sensing parts 11$a$ and 52$a$ of the thermistors 11 and 51 with leads using epoxy resin 10$a$ and 50$a$. The microwave receiving face 52$a$ of the wave absorber 52 of the temperature sensor 50 is printed with Ag paste (H-5723 made by Shoei Kagaku) on it and is sintered keeping the maximum temperature of 800° C. for 10 minutes to make a metal coating 53. This metal coating 53 may be made by means of a thin film forming method such as vaporization, sputtering, and the like.

The heat radiation constant $\delta$ and thermal time constant $\tau$ of the microwave sensor 10 including the thermistor 11, wave absorber 12 and epoxy resin 10$a$ are 6 mW/° C. and 40 seconds respectively. The heat radiation constant $\delta$ and thermal time constant $\tau$ of the temperature sensor 50 including the thermistor 51, wave absorber 52, and epoxy resin 50$a$ are also 6 mW/° C. and 40 seconds, respectively.

A magnetron 18 to generate microwave energy of 2450 MHz is fitted in the inner part of the heating chamber 17, and a blower fan 19 and fan motor 20 are fitted at the back of the inner part of the chamber 17. A turning table 22 which is turned by a motor 23 with a container 21 placed thereon is fitted on the bottom of the heating chamber 17. An intake 24 and outlet 26 are provided respectively near the fan motor 20 and in the ceiling part of the heating chamber 17.

A controller 30 comprising a CPU and memory is provided in the microwave oven 13. The memory stores the relation of above-mentioned expression (1), and each value of the heat radiation constant $\delta$ and thermal time constant $\tau$ of the microwave sensor 10. Output lines of the microwave sensor 10 and temperature sensor 50 are connected to the controller 30, and values $\Theta_1$ and $\Theta_2$ of temperature rise caused by heat generation respectively of the wave absorbers 12 and 52 are entered into the controller 30 as electric signals of the thermistors 11 and 51, respectively. Each output of the controller 30 is connected to the magnetron 18, motors 20 and 23, respectively.

In the microwave oven composed in such a manner, the relation of expression (1), and each value of the heat capacity C and heat radiation constant $\delta$ which are specific to the microwave sensor 10 are previously stored in the controller 30.

When microwave energy reaches the microwave sensor 10 and temperature sensor 50, this sensor 50 reflects it with the metal coating 53 but the wave absorber 12 generates heat by absorbing it. The thermistor 51 comprising the temperature sensor 50 varies in electric resistance with the temperature of the heating chamber whose temperature is influenced by radiant heat of a heated object. The thermistor 11 composing the microwave sensor 10, on the other hand, varies in electric resistance with heat generation corresponding to the microwave power in addition to the temperature of the heating chamber.

The controller 30 finds only the heat generated through absorption of the microwave power by subtracting temperature $\Theta_2$ detected by the thermistor 51 from temperature $\Theta_1$ detected by thermistor 11. The $\Theta_1 \rightarrow \Theta_2$ is substituted for $\Theta$ in the expression (1), then microwave power received by the heated object, considering the heat radiation of the microwave sensor 10 and the variation of the ambient temperature around the sensors, are accurately obtained.

Using the microwave oven arranged in such a manner, a microwave power detection test was made in a state where no object to be heated was put on the turning table 22. A recording device 27 was connected with the controller 30 in order to examine the microwave power irradiated inside of the heating chamber 17.

TEST A'

First, in the state where the microwave output was set to a "Weak" state corresponding to 200 W, microwave energy was irradiated inside of the heating chamber 17 from the magnetron 18 controlled by the controller 30. For comparison, also in a state where the temperature sensor was not connected with the controller, microwave energy was irradiated inside of the heating chamber 17 from the magnetron 18.

Figure 6:
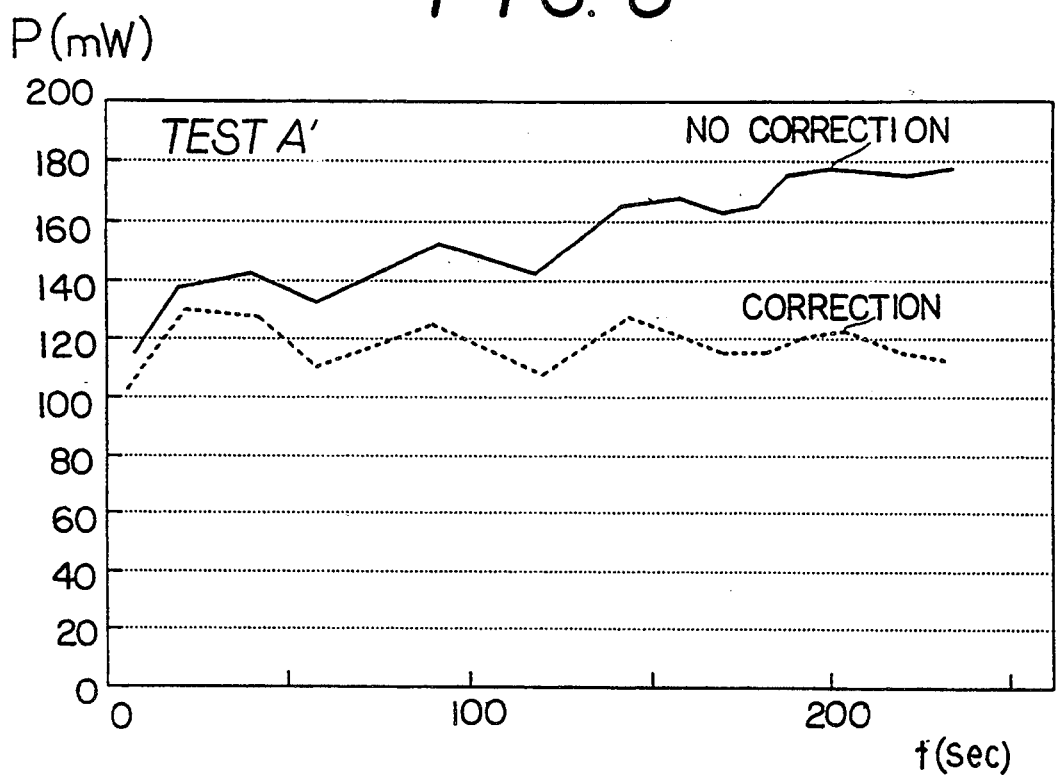
FIG. 6 is a graph showing variation of electric power detected by the second electric power detecting device, when no object to be heated exists, in cases where correction of temperature is made and not made.

Electric power computed by the controller 30 was recorded on the recording device 27. The result is shown in FIG. 6. While the electric power increased slightly with the lapse of irradiation time in the case of not using the temperature sensor 50, that is, in the case of making no temperature correction, the electric power was constant irrespective of the length of irradiation time in the case of making temperature correction with the temperature sensor 50.

TEST B'

Next, each electric power computed by the controller 30 was recorded on the recording device 27, by switching the microwave output among four levels of 150 W, 200 W, 250 W and 300 W, respectively. The result is shown in FIG. 7.

Figure 7:
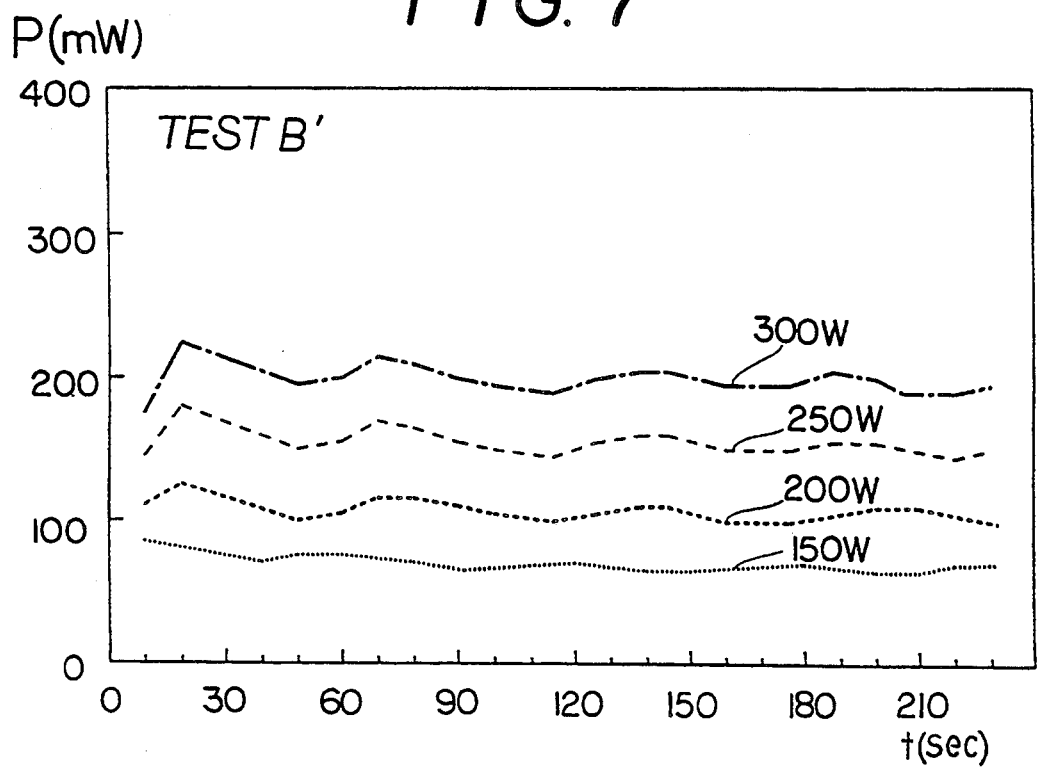
FIG. 7 is a graph showing variation of electric power detected by the second electric power detecting device, when no object to be heated exists, at four levels of microwave output.

As seen from FIG. 7, in the case of making temperature correction with the temperature sensor, each electric power was respectively constant in spite of a long irradiation time at various microwave output levels.

These facts have proved that microwave power can be more accurately detected through correction of the ambient temperature.

Next, the third embodiment of the invention is described in detail on the basis of FIGS. 8 to 11.

Figure 8A:
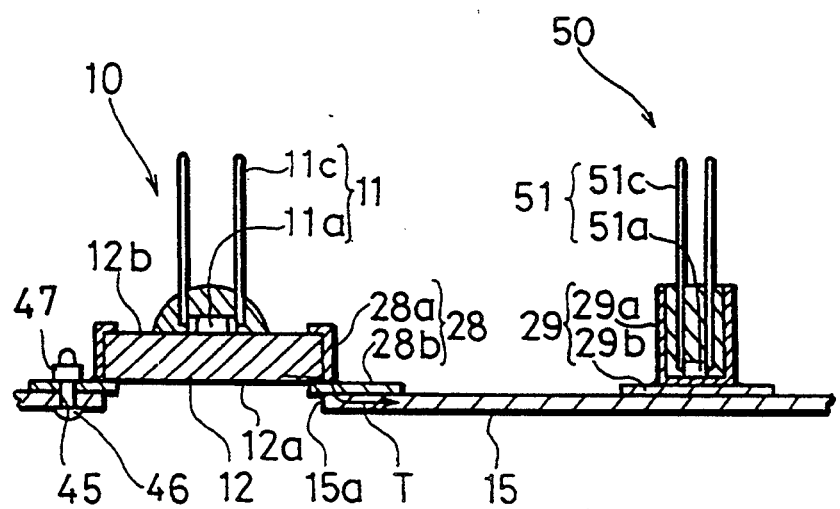
FIG. 8 is a structural illustration of a microwave oven of the third embodiment of the invention.
Figure 8:
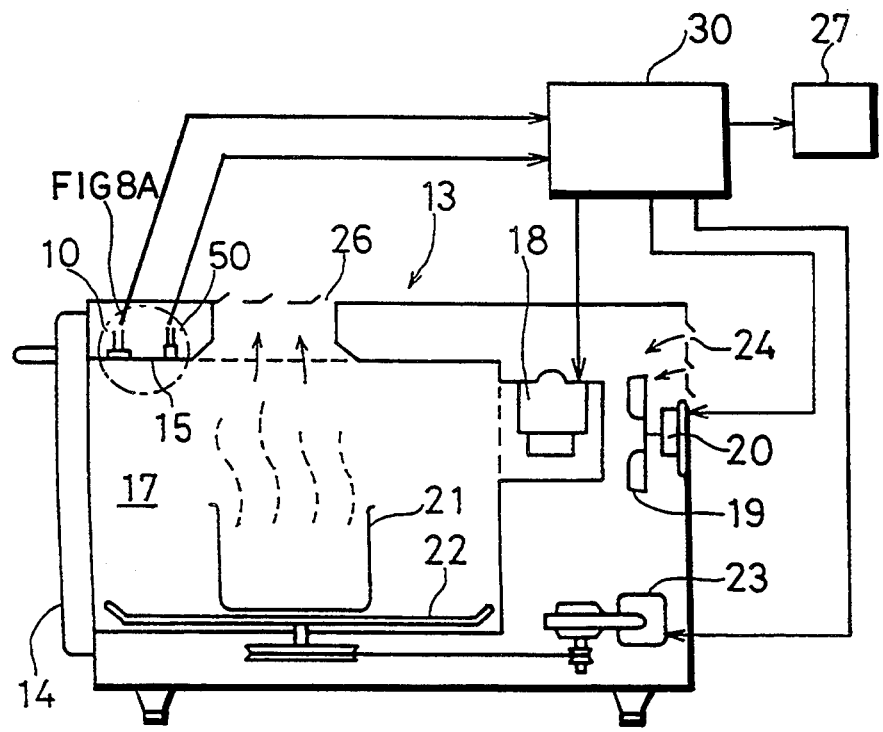

A door 14 is fitted on the front face of the microwave oven 13 so that the door 14 may be opened and closed, as shown in FIG. 8. A microwave sensor 10 and temperature sensor 50 are fitted in parallel on the ceiling part of the heating chamber 17 of the microwave oven 13. The microwave sensor 10 is fixed on the fitting hole 15a formed in the metal wall 15 of the ceiling part by way of a first metal member 28 so as to direct one face 12a of a wave absorber 12 to the inside of the heating chamber, and a second thermistor 51 is fitted on the back face of the metal wall 15 by way of a second metal member 29. This microwave sensor 10 thus structured easily radiates heat when microwave energy is not irradiated on it.

The microwave sensor 10 has the wave absorber 12 to generate heat by absorbing microwave energy and the first thermistor 11 to detect temperature of this absorber 12. The temperature sensor 50 has a second thermistor 51 to detect the ambient temperature around the wave absorber 12.

A magnetron 18 to generate microwave energy of 2450 MHz is fitted in the inner part of the heating chamber 17, and a blower fan 19 and fan motor 20 are fitted at the back of the inner part of the chamber 17. Lead wires 11c and 51c of the thermistors 11 and 51 are fitted at a location where they do not receive microwave energy from the magnetron 18.

A turning table 22 with a container 21 placed thereon is turned by a motor 23 and fitted on the bottom of the heating chamber 17. An intake 24 and outlet 26 are provided respectively near the fan motor 20 and in the ceiling part of the heating chamber 17.

A controller 30 comprising a CPU and memory is provided in the microwave oven 13. The memory stores the relation of above-mentioned expression (1), and each value of the heat radiation constant $\delta$ and thermal time constant $\tau$ of the microwave sensor 10. Output lines of the microwave sensor 10 and temperature sensor 50 are connected to the controller 30. Value $\Theta_1$ of temperature rise caused by heat generation of the wave absorber 12 and value $\Theta_2$ of temperature rise caused by heat transfer through the metal member 29 are inputted into the controller 30 as electric signals of the thermistors 11 and 51, respectively. The heat transferred through the metal member 29 includes heat of the metal wall 15 given by heat radiation of a heated object in the microwave oven 13 and heat of the metal wall 15 transferred through the metal member 28 from the absorber 12 which heat is shown as symbol T in FIG. 8. Each output of the controller 30 is connected to the magnetron 18, motors 20 and 23, respectively.

Figure 9:
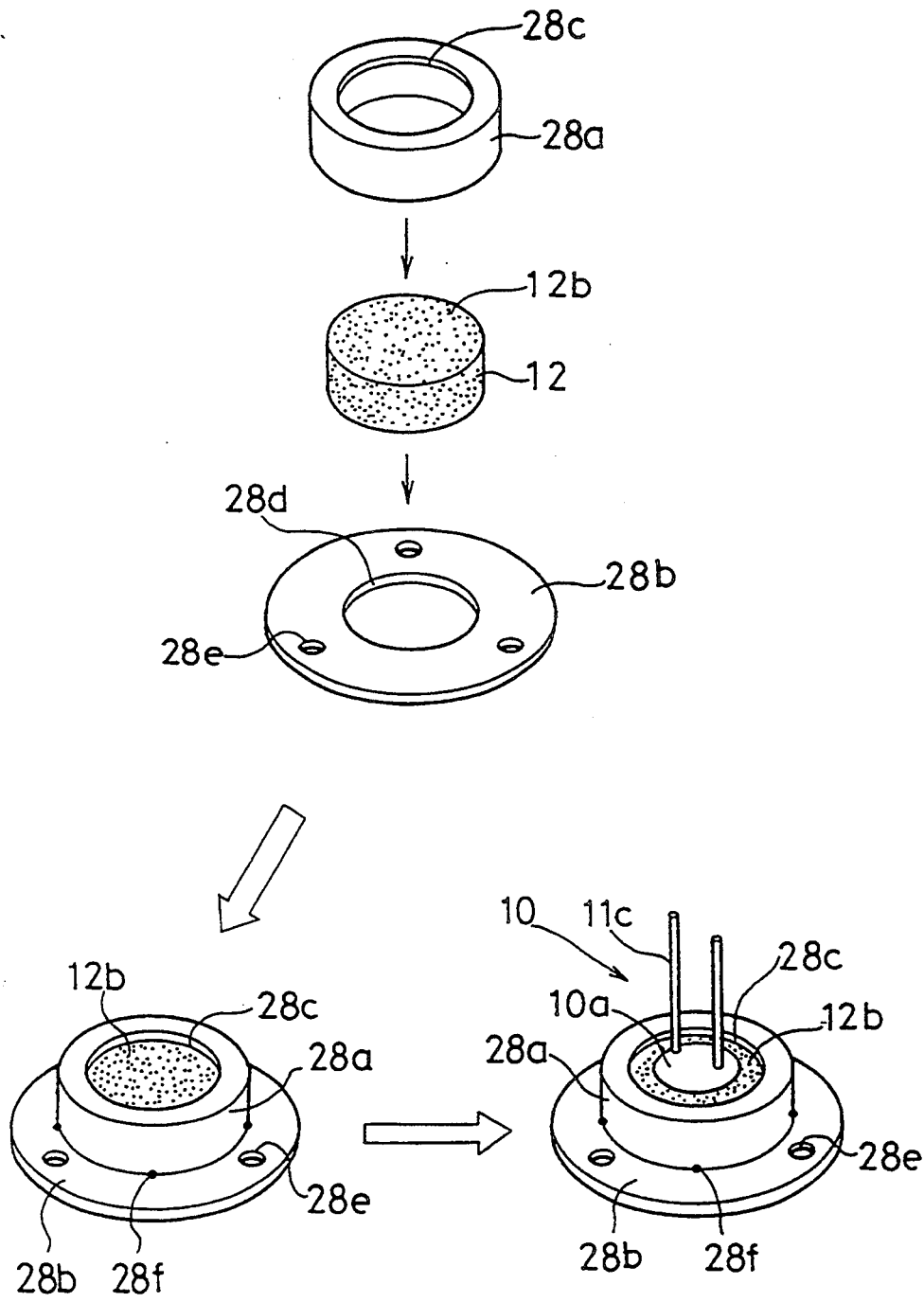
FIG. 9 is a perspective view to show an assembling process of a microwave sensor of the third electric power detecting device.

FIG. 9 shows an assembling process of the microwave sensor 10. A disk-shaped wave absorber 12 of 10 to 30 mm in diameter and 0.5 to 5 mm in thickness is prepared in advance. A disk plate 28b is prepared which is 0.2 to 1 mm thick which is provided in the central part a hole 28d which is 4 to 6 mm smaller in diameter than the outer diameter of the wave absorber 12. Plate 28b has three screw-through holes 28e formed around the hole 28d, with outer diameter 5 to 20 mm larger than that of the wave absorber 12. A cylindrical member 28a is prepared which is 0.2 to 1 mm thick which is provided, in the central part, with a hole 28c which is 4 to 6 mm smaller in diameter than the outer diameter of the wave absorber 12, and being capable to suitably accommodate therein the wave absorber 12. The cylindrical member 28a and disk plate 28b are respectively made of the same metal material, which is for example chosen out of metal material such as aluminum, iron, copper, stainless steel, brass, and the like. The wave absorber 12 is made of SiC-sintered material.

The wave absorber 12 is first put on the disk plate 28b, and is covered with the cylindrical member 28a, and then the cylindrical member 28s is spot-welded 28f onto the disk plate 28b. The wave absorber 12 is held by the cylindrical member 28a and disk plate 28b in this manner. The cylindrical member 28a and disk plate 28b form the first metal member 28 of the invention. Next, the thermistor 11 is fixed on the central part of the upper face 12b of the wave absorber whose face 12b is exposed from the hole 28c of the cylindrical member 28a, by covering the thermistor body with organic or inorganic material, so that the temperature sensing part 11a (FIG. 8) of the thermistor 11 with leads may come into contact with that central part of the upper face 12b. In this example, the thermistor 11 is fixed with epoxy resin 10a. Although not shown in the figure, it is desirable to provide the lead wires 11c of the thermistor 11 with insulating covers, respectively.

Some organic materials, other than epoxy resin, to fix the thermistor 11 include phenol resin, silicone resin, polyimide resin, and the like. Fixing methods using inorganic material include a method in which after molding the thermistor with the paste which is made by mixing with water the material having silica and alumina as its main ingredients into a pasty state, the water is evaporated at about 80° C. and then heat treated at about 150° C.

The microwave sensor 10 is fixed on the metal wall 15 by passing the screws 46 through screw-through holes 28e of the disk plate 28b corresponding to the flange part of the metal member 28 and through the through holes 45 of the metal wall 15, and then tightening the screws 46 and nuts 47 with each other.

Figure 10:
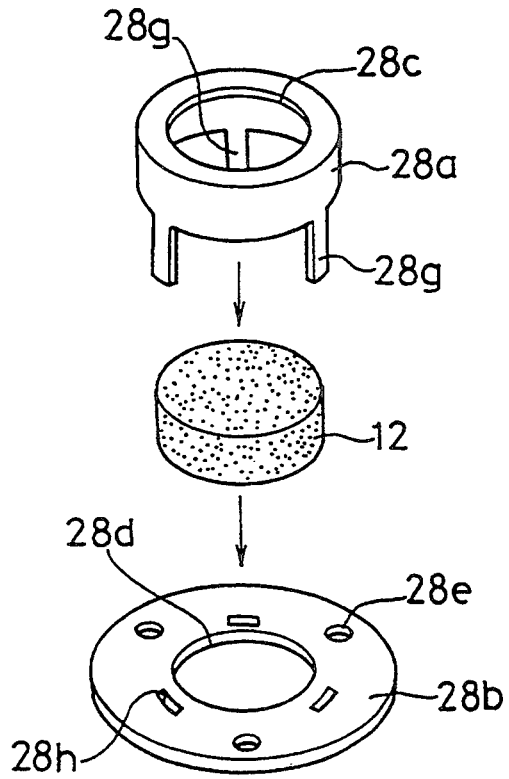
FIG. 10 is a perspective view to show an assembling process of another microwave sensor of the third electric power detecting device.
Figure 10:
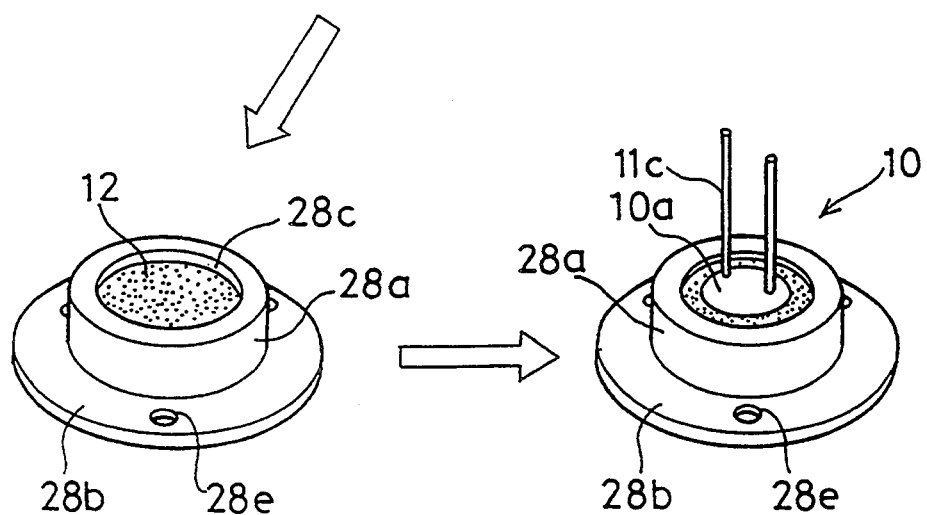

FIG. 10 shows another assembling process of the microwave sensor 10. The assembling process in this example integrates the cylindrical member 28a and disk plate 28b in one body by forming claws 28g at three locations of the lower end of the cylindrical member 28a, making through holes 28h in the disk plate 28b through which the claws 28g are inserted, inserting the claws 28g through the through holes 28h, and then by bending, instead of integrating the cylindrical member 28a and disk plate 28b by means of spot-welding.

Figure 11:
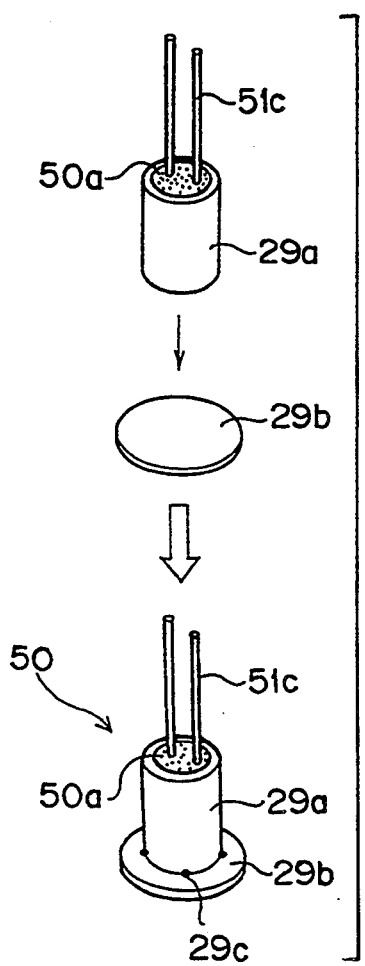
FIG. 11 is a perspective view to show an assembling process of a temperature sensor of the electric power detecting device of the third embodiment.

FIG. 11 shows an assembling process of the temperature sensor 50. A disk plate 29b of 0.2 to 1 mm thick and 6 to 20 mm in diameter is prepared beforehand. A cylindrical member 29a is prepared having a thickness of 3 to 5 mm and outer diameter of 4 to 10 mm. First, the second thermistor 51 with leads 51c is fixed in the cylindrical member 29a by filling up epoxy resin 50a therein in a state of keeping the temperature sensing part 51a of the thermistor 51 being in contact with the inner bottom part of the cylindrical member 29a. Next, the outer bottom part of the cylindrical member 29a is spot-welded 29c onto the disk plate 29b. The temperature sensor 50 is fixed on the back face of the metal wall 15 by spot-welding the bottom face of the disk 29b onto the wall 15. The cylindrical member 29a and disk plate 29b are made of the same material as the cylindrical member 28a and disk plate 28b of the microwave sensor 10. The cylindrical member 29a and disk plate 29b form the second metal member 29 of the invention.

The temperature sensing parts 11a and 51a of the thermistors 11 and 51 are respectively made of sintered material of metal oxide comprising Mn, Co, and Ni as its main ingredients, and are formed by soldering lead wires 11c and 51c onto both ends thereof, respectively. Resistance values of both thermistors 11 and 51 at 25° C. are respectively 100 kΩ, and their B constants are respectively 3965 K.

As shown in FIG. 8, one face 12a of the wave absorber 12 is a microwave absorbing face, and the other face 12b has the temperature sensing part 11a of the thermistor 11 fixed thereon.

The heat radiation constant $\delta$ and thermal time constant $\tau$ of the microwave sensor 10 comprising the thermistor 11, wave absorber 12, and epoxy resin 10a are 6 mW/° C. and 40 seconds respectively.

In the microwave oven arranged in such a manner, when microwave energy reaches the microwave sensor 10, the wave absorber 12 generates heat by absorbing it. The thermistor 51 composing the temperature sensor 50 varies in electric resistance by the heat transferred to the metal wall 15. This heat is the heat transferred from one or both of the heated object and wave absorber 12. On the other hand, the thermistor 11 of the microwave sensor 10 varies in electric resistance with heat generated by the wave absorber 12 corresponding to the microwave power in addition to the ambient temperature around the thermistor 11.

The controller 30 finds only the heat generated through absorption of the microwave power by subtracting temperature $\Theta_2$ detected by the thermistor 51 from temperature $\Theta_1$ detected by the thermistor 11.

If the relation of expression (1), and each value of the heat capacity C. and heat radiation constant $\delta$ specific to the microwave sensor 10 are in advance stored in the controller 30, and the above-mentioned $\Theta_1 \rightarrow \Theta_2$ is substituted for $\Theta$ in the expression (1), then the microwave power received by the heated object considering the heat radiation of the microwave sensor 10 and variation of the ambient temperature around the sensors are accurately obtained.

Using the microwave oven arranged in such a manner, a microwave power detection test was made without placing an object to be heated on the turning table 22. A recording device 27 was connected with the controller 30 in order to examine the microwave power irradiated inside of the heating chamber 17. As a result of performing successively the same Test A and B as the second embodiment, the same result was obtained.

As a microwave sensor which is a main component of a microwave oven of the invention, various constructions other than the above-mentioned examples can be also used, as shown in FIGS. 12 to 24.

Figure 12:
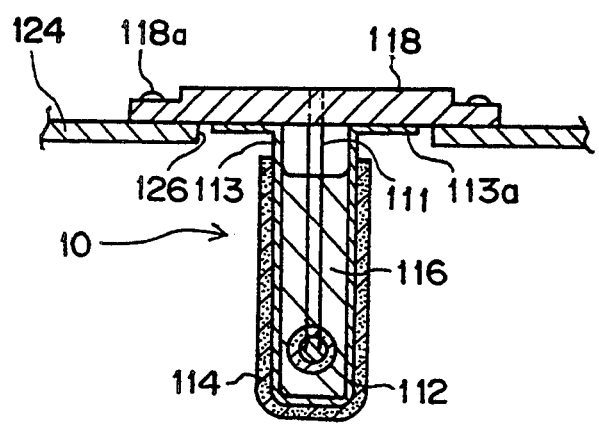
FIG. 12 is a cross-sectional view of an example of a variation of the microwave sensor of the invention.

The microwave sensor 10 shown in FIG. 12 is provided with a thermistor 112 with lead wires 111, a metal cover 113 to cover the thermistor 112 and its leads 111 together in close vicinity of the thermistor 112, and a wave absorbing layer 114 fitted on the surface of the metal cover 113.

As the thermistor 112, a publicly known device can be used such as bead, disk, rod, thick film, thin film, chip integrated-with-electrodes type, or the like. As a device with lead wires, a device of glass-coated bead type which is coated with glass or glass-sealed type which is sealed into a glass tube is desirable because of its heat resistance of about 200° to 400° C. A thermistor of glass-coated bead type is made by coating the thermistor body with melted glass after welding two fine dumet wires onto a thermistor body of bead type.

It is desired that metal cover 113 have a small heat capacity in order to improve its response speed, and also to have a shape which prevents the lead wires from exposure to microwave energy. The metal cover 113 is grounded to prevent electric discharge which may be caused by microwave energy. For this reason, the metal cover is made of material such as copper, stainless steel, or the like which is heat resisting and electrically conductive. If the metal cover has a pointed part in its shape, an electric discharge phenomenon is prone to be caused by concentration of microwave energy upon the pointed part. It is desired that the metal cover therefore have a one-end-sealed can-type shape such as a cylinder, square prism, or the like which has a comparatively broad area to receive microwave energy and does not have such a pointed part. In the case of a cylinder type, the inner diameter of the cylinder is desired to be equal to or slightly larger than the outer diameter of the thermistor body so that the cylinder may cover the thermistor in close vicinity of the thermistor 112 with lead wires. The metal cover 113 may be provided with a flange 113a at its base end in order to make it easy to fit the metal cover on the microwave oven.

The wave absorbing layer 114 is provided on the surface of the metal cover 113. This wave absorbing layer 114 is made of one or both of organic and inorganic materials containing wave absorbing powder as filler. This wave absorbing powder is ceramic powder having one or both of magnetism and dielectricity. Wave absorbing powder with magnetism includes ferrite powder or ceramic powder containing ferrite as its main ingredient, and wave absorbing powder having dielectricity includes one or more of ceramic powder selected from the group $SiC$, $Al_2O_3$, $B_4C$, $SrTiO_3$, ZrO$_2$, Y$_2$O$_3$, PZT, and PLZT. Wave absorbing powder having both magnetism and dielectricity includes a ceramic powder having both magnetic loss and very large dielectric loss which has a reaction phase formed among ferrite particles or among ferrite particles and perovskite-type compound particles, and made by means of sintering at 1000° to 1500° C. a mixed material which is obtained by mixing magnetic material powder comprising fine ferrite particles of 50 μm or less in diameter and dielectric material powder comprising perovskite-type compound particles such as BaTiO$_3$ particles of 10 μm or larger in diameter, which was disclosed in the Unexamined Published Japanese Patent Application No. 1-291406.

The base material of the wave absorbing layer 114 is used as an adhesive agent of the wave absorbing powder onto the metal cover 113. A material of high heat resistance and high heat conductivity is desirable for the wave absorbing layer 114. As an organic base material, for example, heat-resistant resin resistive to 200° to 300° C. is used, such as epoxy resin, phenol resin, silicone resin, fluororesin, or the like, or heat-resistant resin resistive to 300° to 400° C., such as polyimide resin, or the like is used. For an inorganic base material, for example, glass paste is used. Other materials can also be used, such as a composite material ("Chirano Polymer Coat AL-15" made by Ubekosan, Inc.) obtained by mixing inorganic fiber of Si-Ti-C-O compounds ("Chirano Fiber" by Ubekosan, Inc.) with the above-mentioned heat-resistant resin, such as epoxy resin or the like. This composite material has heat resistance of about 800° C. Epoxy resin and the above-mentioned composite material are desirable in view of their high heat resistance and high heat conductivity.

The wave-absorbing-powder content of the wave absorbing layer is increased in order to improve its wave absorbing efficiency. Though this content varies with kinds of organic or inorganic materials which are base materials, it is desired that the base materials contain about 10 to 50% by weight of the wave absorbing powder.

The wave absorbing layer 114 is formed as described below. First, a coating solution is prepared by melting one or both of the organic and inorganic materials and then uniformly mixing the obtained liquid with the wave absorbing powder. Metal cover 113 is dried after being dipped in the coating solution to a specified depth. Most of the outer surface of the metal cover 113 is coated with wave absorber layer 114 by means of this dip coating. The wave absorber layer 114 is desired to be as thin as about tens to hundreds μm in thickness in order to prevent exfoliation of the wave absorber layer 114 caused by a difference in thermal expansion between the layer 114 and the metal cover 113.

A manufacturing process of the microwave sensor 10 is described below. After the thermistor 112 with lead wires is inserted into the metal cover 113, it is fixed with filler 116. The filler may be some ceramic containing, as main ingredients, silica and alumina in addition to said organic and inorganic materials used in forming the wave absorbing layer 114. In order to fix the thermistor 112 with the filler 116 in the metal cover 113, the dip-coated thermistor 112 may be inserted into the metal cover 113, after the filler is melted and the thermistor 112 is dip-coated with this filler solution, or the melted filler may be poured into the metal cover 113 after the thermistor 112 is inserted into the metal cover 113. The wave absorbing layer 114 may be formed either before the thermistor 112 is inserted into the metal cover 113 or after the thermistor 112 is inserted into the metal cover 113 and fixed with the filler in the cover 113.

The microwave sensor 10 of such structure is fixed on the frame 124 of the microwave heating device with a fitting plate 118 and screws 118a.

Figure 13:
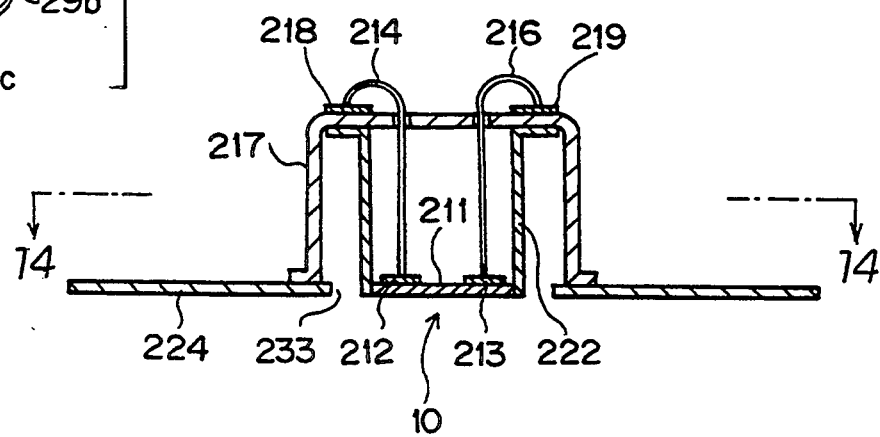
FIG. 13 is a cross-sectional view taken along the M-M line of FIG. 14 showing structure of another example of a variation of the microwave sensor of the invention.
Figure 14:
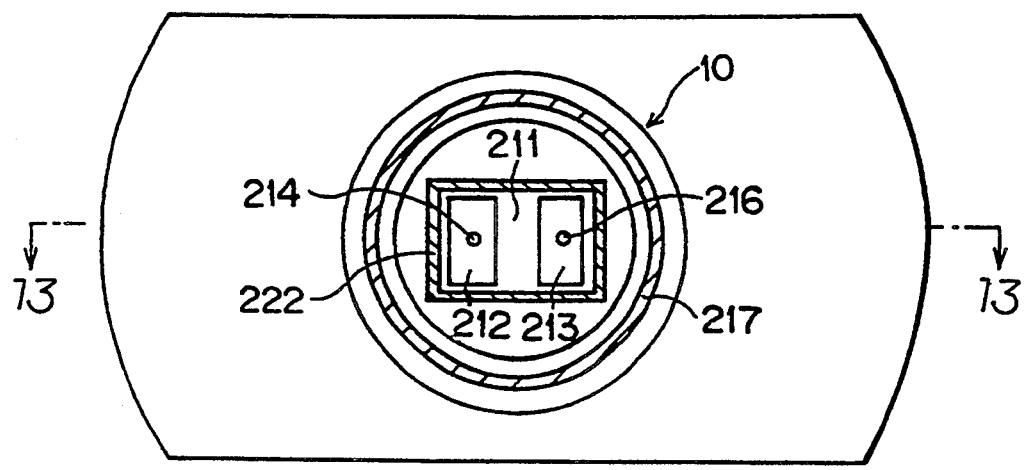
FIG. 14 is a cross-sectional view taken along the L-L line of the microwave sensor shown in FIG. 13.

The microwave sensor 10 shown in FIGS. 13 and 14 is provided with a wave absorber 211 having a semiconductor characteristic and capable of absorbing microwave energy and a pair of electrodes 212 and 213 which are formed separately from each other with a certain space on the face not receiving microwave energy of the wave absorber 211. The electrodes 212 and 213 of the microwave sensor 10 are respectively connected with one of the ends of lead wires 214 and 216. The other ends of the lead wires 214 and 216 pass through the cap-shaped fitting member 217 and are respectively connected with the lead electrodes 218 and 219 fitted on the upper face of the fitting member 217. The fitting member 217 is fixed on the upper face of the frame 224 forming the ceiling part of the microwave heating device described later. A cover 222 is provided to cover the lead wires 214 and 216 in close vicinity thereof so that they may avoid-microwave energy. One end of the cover 222 is adhered to the side of the wave absorber 211 and the other end thereof is adhered to the inner face of the top of the fitting member 217. The cover 222 is made of ceramic or heat-resistant plastics.

As a material having semiconductor characteristics and capable of absorbing microwave energy for the wave absorber 211, mention is made of an oxide material containing at least one of the transition metal elements such as Mn, Co., Ni, Fe, Cu, and the like, or a non-oxide material containing one or both of β-SiC and B$_4$C as its main ingredient. The oxide material is desired to be an oxide material containing one or more elements selected from Mn, Co, and Ni, and one or more elements selected from Fe, Al, and Cu. A transition metal oxide material containing Fe is particularly desirable since it often has ferromagnetism and also improves microwave absorption effect by acting on the magnetic field components of microwave energy as well.

The wave absorber 211 is made by means of a general method of manufacturing ceramic as described below. First, after mixing the materials of the wave absorber 211 with a binding agent at a specified metal elements ratio, the mixed material is temporarily baked and crushed. After granulating the crushed material, molding them, and baking the molded material in a block, the baked block is worked into a specified shape to obtain the wave absorber 211 in a desired shape. The wave absorber 211 is desired to be several hundreds μm to several millimeters in thickness in consideration of its mechanical strength.

According to a method of manufacturing the microwave sensor, on the face not receiving microwave energy of the wave absorber 211 made as described above, a pair of electrodes 212 and 213 are formed separately from each other with a certain space by means of screen printing, sputtering, vaporization, and the like. The paste used in screen printing contains such metals as Ag/Pd alloy, Cu, Au, Ag, and the like. These metals are also used in sputtering and vaporization. If an undercoating layer (not shown in the figures) made of a metal such as Pd, Cr, Ti, and the like is provided between the wave absorber 211 and a pair of electrodes 212 and 213, the adhesive strength of the electrodes becomes further improved. The lead wires 214 and 216 are respectively connected with the electrodes 212 and 213 and the lead electrodes 218 and 219 by means of soldering, spot welding, wire bonding, or the like.

If the electrodes to be connected with the lead wires 214 and 216 are made of Ag/Pd alloy, Cu, or Ag, soldering in particular is desirable. The lead wires 214 and 216 to be made of Au, Pt, Cu, Ag, or the like are preferred to be several tens to several hundreds μm in diameter. When the lead wires 214 and 216 are made by spot-welding Pt wires, they are very high in heat resistance.

Figure 15:
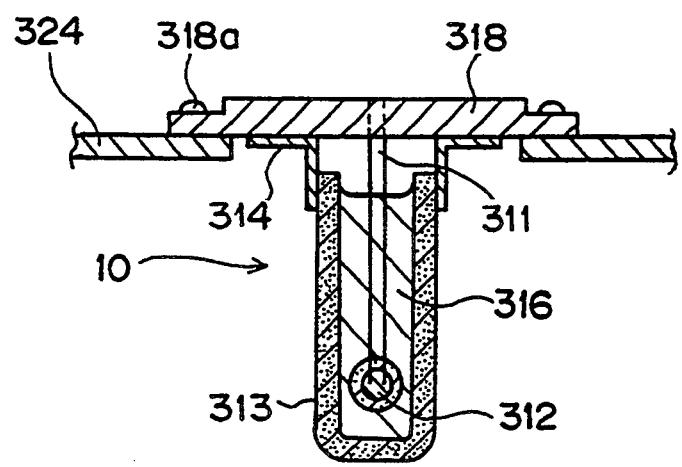
FIG. 15 is a cross-sectional view of another example of a variation of the microwave sensor.

The microwave sensor 10 shown in FIG. 15 is provided with a thermistor 312 with leads 311 and a wave absorber 313 to cover the thermistor 312 together with its leads 311 in close vicinity of the thermistor 312.

For use as the thermistor 312 composing the microwave sensor 10, a publicly known device can be utilized of such type as bead, disk, rod, thick film, thin film, chip, integrated-with-electrodes type, or the like. As a device with leads, a device of glass-coated bead type coated with glass or glass-sealed type sealed into glass tube is desirable because of its heat resistance of about 200° to 400° C. A thermistor of glass-coated bead type is made by coating the thermistor body with melted glass after welding two fine dumet wires onto the thermistor body of bead type.

The wave absorber 313 is made of the same wave absorbing powder as the powder used in making the wave absorber composing the microwave sensor 10 shown in FIG. 12.

The microwave absorber 313 needs to have a shape so as to prevent its leads 311 from receiving microwave energy and its shape is desirable to be a one-end-sealed can-type shape as a cylinder, square prism, or the like. In the case of a cylinder type, it is desirable for the inner diameter of the cylinder to be equal to or slightly larger than the outer diameter of the thermistor body so that the cylinder may cover the thermistor in close vicinity of thermistor 312 with leads. In order to make the wave absorber 313, ceramic powder having one or both of magnetism and dielectricity singly or, if necessary, together with a binding agent by means of metal mold or the like, may be compression molded in a cylinder shape as shown in FIG. 15, and baking the cylinder-shaped block, or the baked prism-shaped block may be also worked into a cylinder or square prism by means of machining after molding the ceramic powder into a cylinder or square-prism shape. As shown in FIG. 15, a flange 314 made of metal or plastic may be provided at the base end of the wave absorber 313 in order to make the fixing of the wave absorber 313 on the microwave heating device easy.

In a manufacturing process of the microwave sensor 10, the thermistor 312 with leads 311 is inserted into the wave absorber 313, and then is fixed with filler 316. A material of high heat resistance and high thermal conductivity is desirable as the filler. For use as such kind of material, for example, heat-resistant resin resistive to 200° to 300° C. such as epoxy resin, phenol resin, silicone resin, fluororesin, or the like and another heat-resistant resin resistive to 300° to 400° C. such as polyimide resin or the like are utilized. Ceramic having silica and alumina as its main ingredient is mentioned as filler of a higher heat resistance. The filler is desirable to be an inorganic material since ceramic which is inorganic material having generally higher thermal conductivity. In order to fix the thermistor 312 in the wave absorber 313 with the filler 316, a method may be used where the dip-coated thermistor 312 may be inserted into the wave absorber 313, after the filler is melted and the thermistor 312 is dip-coated with this filler solution, or the melted filler may be poured into the wave absorber 313 after the thermistor 312 is inserted into the wave absorber 313.

The microwave sensor 10 of such structure is fixed on the frame 324 of the microwave heating device with a fitting plate 318 and screws 318a.

Figure 16:
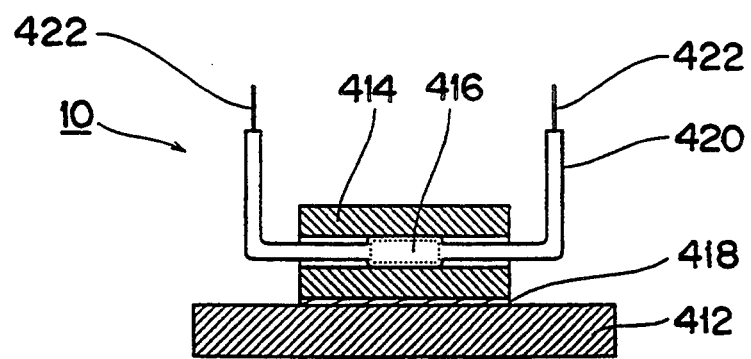
FIG. 16 is a cross-sectional view taken along the N-N line of FIG. 17 showing the structure of another example of a variation of the microwave sensor.
Figure 17:
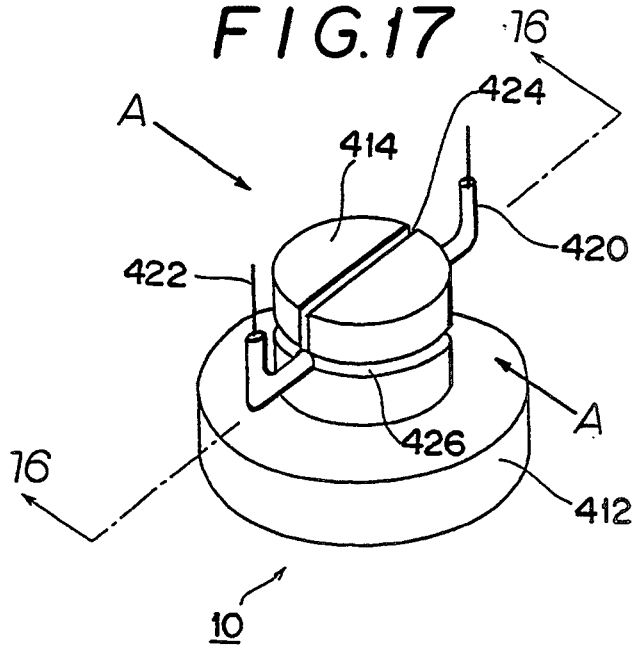
FIG. 17 is a perspective view of the microwave sensor shown in FIG. 16.
Figure 18:
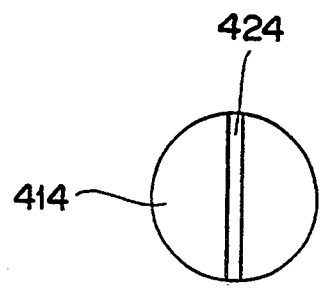
FIG. 18 is a plan view of a metal member composing the microwave sensor shown in FIG. 16.
Figure 19:
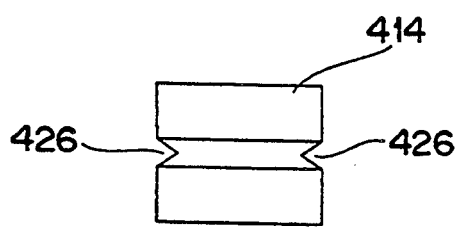
FIG. 19 is a front view of the metal member of FIG. 18.
Figure 20:
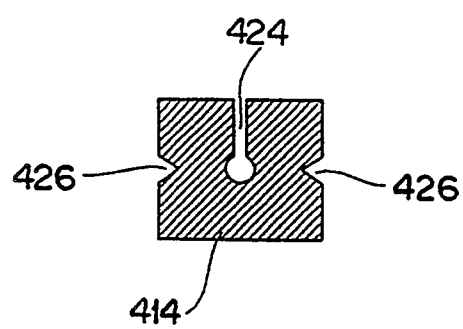
FIG. 20 is a central cross-sectional view of the metal member of FIG. 18.

A microwave sensor 10 shown in FIGS. 16 and 17 whose front face is a face to receive microwave energy, is provided with a wave absorber 412, capable of absorbing microwave energy; a metal member 414 adhered to its back face not receiving the microwave of the wave absorber 412, and a thermistor 416, held by the metal member 414, to detect temperature of the wave absorber 412 through the metal member 414. In the microwave sensor 10, it is desirable that the wave absorber 412 is in a flat shape and has a joining area 418 at the central part of its back face to join the metal member 414 thereto, the thermistor 416 has leads 422 coated with insulating material 420 at both ends thereof, and the metal member 414 has a slit 424 to hold the thermistor 416 attached with leads 422 and an engaging groove 426 for fitting the microwave sensor 10 on a fitting body.

In this microwave sensor 10, the metal member 414 and thermistor 416 can be easily joined with each other merely by inserting the thermistor 416 into the slit 424 and caulking the slit 424. The microwave sensor 10 can be easily fitted on a body to be fitted by fitting a fixture of the body-to-be-fitted into the holding groove 426.

The wave absorber 412 of the microwave sensor 10 is made of the same wave absorbing powder as the one used in making the wave absorber composing the microwave sensor 10 shown in FIG. 12.

The wave absorber 412 is made by means of a method in which ceramic powder of the magnetic material and/or dielectric material is compression-molded together with a binding agent in the shape of a flat plate and then the molded block is backed to form a wave absorber, or another method in which slurry is prepared by kneading the ceramic powder together with a binding agent and a solvent; this slurry being formed into a sheet, a flat piece is punched out therefrom, and baked to form a wave absorber. In this example, as shown in FIG. 17, the wave absorber 412 has a disk shape of 10 to 30 mm in diameter and 1 to 3 mm in thickness and receives microwave energy on its front face.

On the central part of the back face of the wave absorber 412 formed is a metal layer 418 forming a joining part to join the metal member 414 thereto. The metal layer 418 is composed of metal such as Cu-Zn, Zn, Ag, Ag-Pd, or the like, and is formed by means of thermal spraying, vaporization, metal paste printing, or the like.

As shown in FIGS. 16 to 20, a slit 424 which passes through the center of the upper face of the metal member 414 and has a specified depth is formed in the metal member 414. In this example, the metal member 414 has a cylindrical shape of 5 to 10 mm in diameter and 3 to 5 mm in thickness. The slit 424 is formed in the metal member 414 from its upper face to the depth of just one half of its thickness, and at the bottom of the slit 424 formed is a through hole wider than the slit 424 for fitting the thermistor 416 with the leads 422 there into.

On the outer circumferential face of the metal member 414 is formed the engaging groove 426 for fitting the microwave sensor 10 on a body to be fitted such as a microwave oven.

It is desirable for the metal member 414 to be made of a metal having good thermal conductivity and high heat resistance, such as Cu-Zn alloy, aluminum, or the like.

Figure 21:
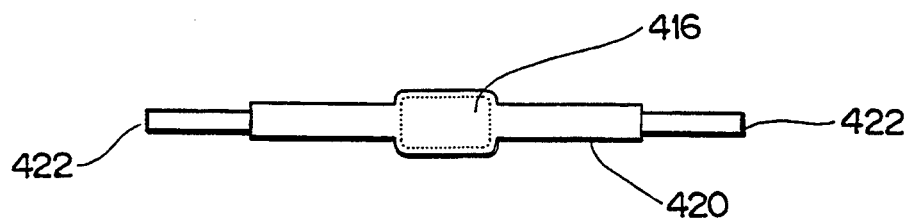
FIG. 21 is a plan view of a thermistor composing the microwave sensor of FIG. 16.

The thermistor 416 is desired to be small-sized and heat-resistant, and as shown in FIG. 21, a glass-coated bead type coated with glass is thus desirable because of its heat resistance being about 200° to 400° C. A thermistor of glass-coated bead type is made by coating the thermistor body with melted glass after welding two fine lead wires 422 on both ends of the thermistor body 416 of bead type. In this example, the lead wires 422 are coated in the vicinity of the thermistor body 416 with an insulating material 420 having heat resistance, such as Teflon, polyimide, or the like.

Figure 22:
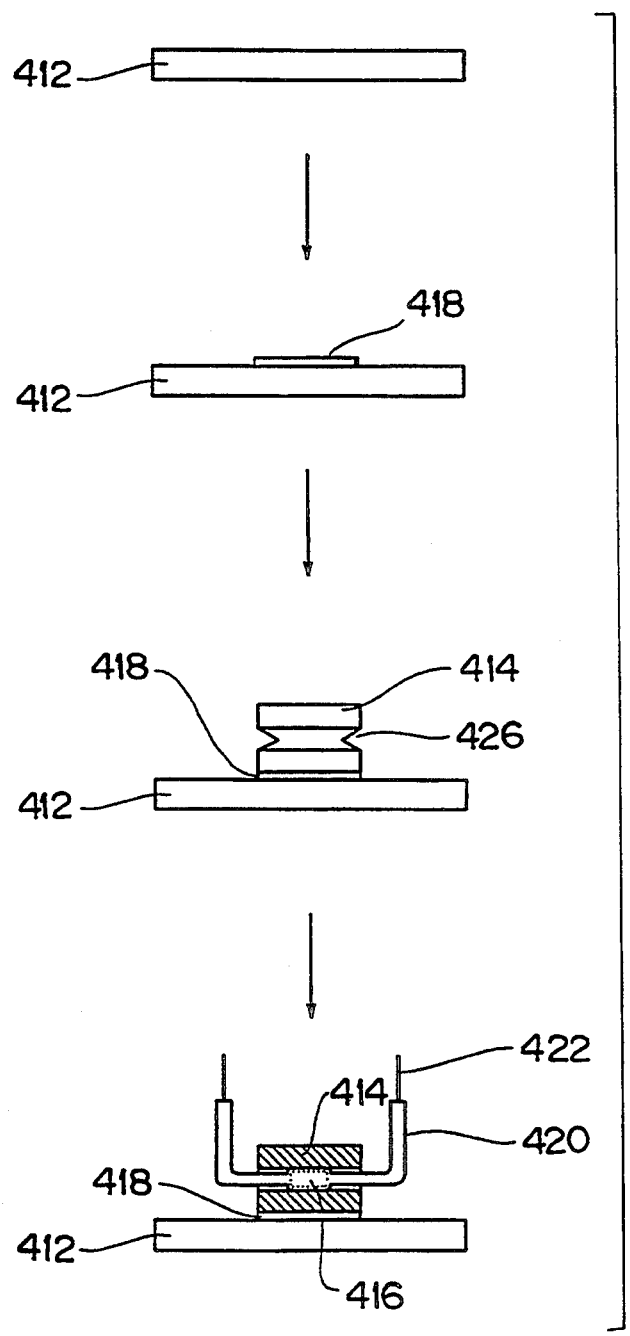
FIG. 22 is an illustration to show an assembling process of the microwave sensor of FIG. 16.

In a manufacturing process of the microwave sensor 10, a flat shape wave absorber 412 is first prepared as shown in FIG. 22. On the central part of the back face of the wave absorber 412 is formed a metal layer 418 forming a joining part to join the metal member 414 thereto. The metal member 414 is joined with the metal layer 418 by means of a joining technique such as high-temperature soldering, brazing, or the like. Next, the thermistor 416 with lead wires 422 attached and coated with an insulating material 420 at both ends thereof is fitted into the slit 424 of the metal member 414 (see FIGS. 16 to 20). In this fitting of the thermistor into the slit, a part of respective lead wires 422 is previously bent at right angle as illustrated in FIGS. so that each lead part of the lead wires 422 may be prevented from being hidden behind the wave absorber 412 and receiving microwave energy after the fitting.

After fitting the thermistor 416 into the slit 424, the thermistor 416 is fixed in the through hole at the bottom of the slit 424 by caulking the metal member 414 with application of force thereto from the directions of arrows A to metal body 414.

Figure 23:
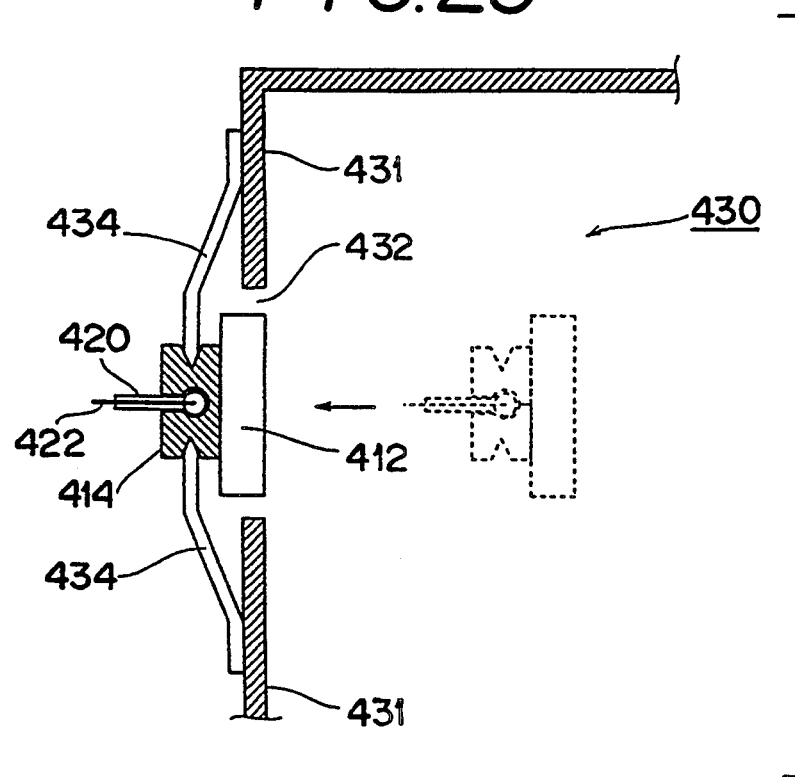
FIG. 23 is a cross-sectional view to show how to fit the microwave sensor of FIG. 16 on the microwave oven which is an object to be fitted.
Figure 24:
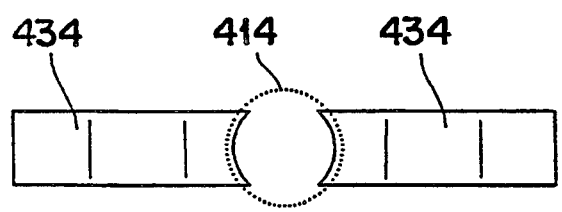
FIG. 24 is a plan view of a fixture used for fitting the sensor as shown in FIG. 23.

As an example, a process of fitting the microwave sensor 10 on a microwave oven 430 which is a body to be fitted is described by referring to FIGS. 23 and 24.

First, an opening 432 for fitting the microwave sensor 10 is provided in a part of the inner wall 431 of the microwave oven 430. Each base end of fitting members 434 and 434 composed of a pair of flat springs facing each other is fixed near the opening 432 on the outside of the inner wall 431. Each top end of a pair of fitting members 434 and 434 is fitted outside of the inner wall 431 facing to the opening 432, and keeps a space between their top ends for holding the metal member 414 with the holding groove 426. Each top end of the fitting members 434 and 434 keeps a specified height form the inner wall 431 so that the front face of the wave absorber 412 may come to the same level as the face of the inner wall 431 in a state of holding the microwave sensor 10 with the engaging groove 426.

In order to fit the microwave sensor 10 in the opening 432 of the microwave oven composed in such a manner, the microwave sensor 10 is inserted in the opening 432 from inside of the heating chamber of the microwave oven 430 so that the leads 422 may be exposed outside of the inner wall 431, and then the metal member 414 is held by fitting each top end of the fitting members 434 and 434 into the engaging groove 426 of the metal member 414.

Figure 25:
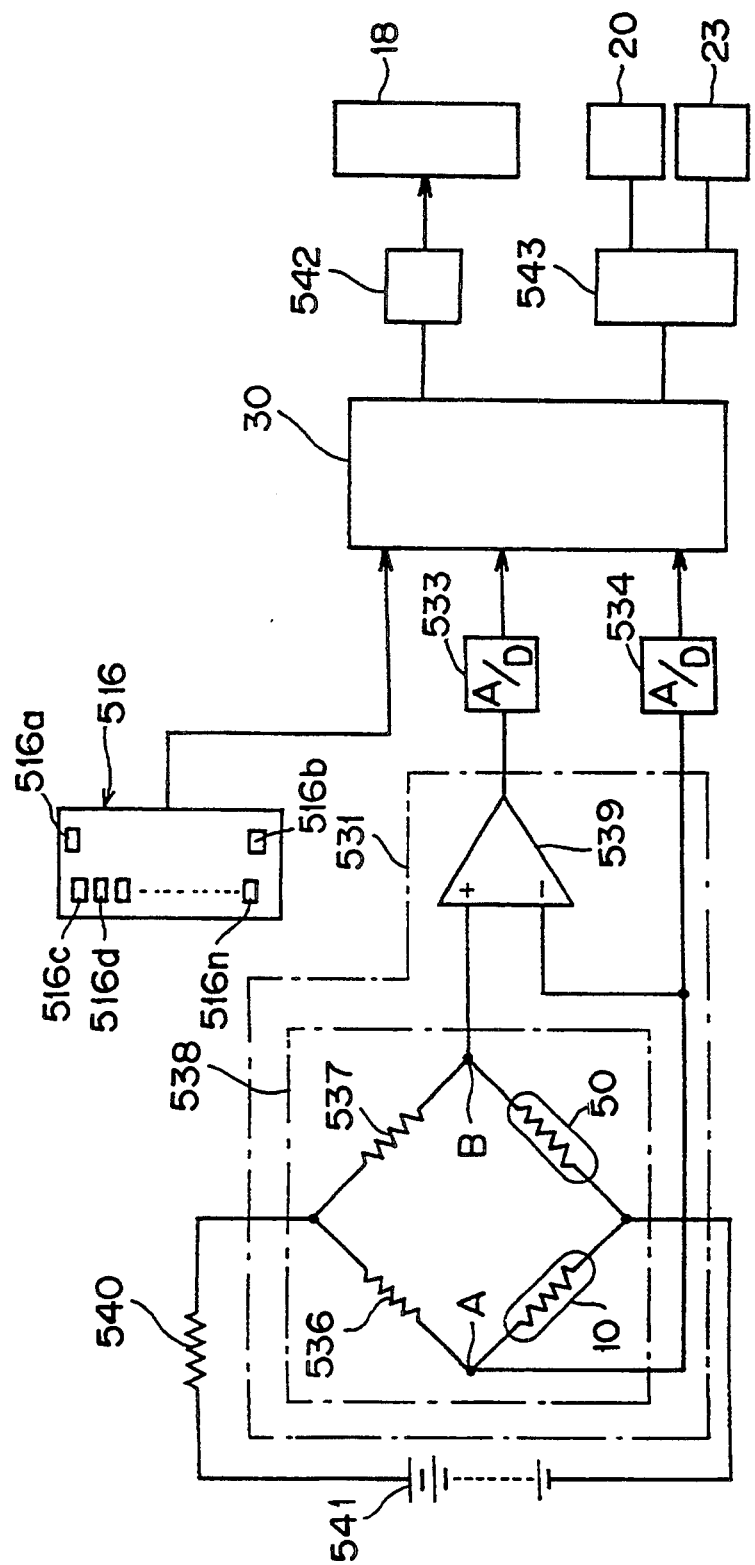
FIG. 25 is a circuit diagram of the bridge circuit used for controlling the magnetron of the microwave oven in the third embodiment of the invention.
Figure 26:
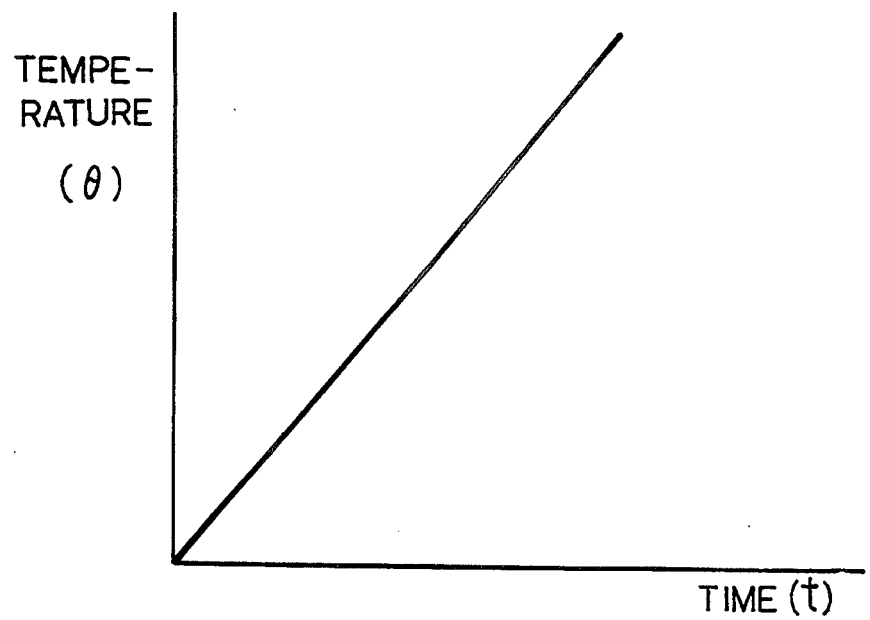
FIG. 26 is a graph showing variation of temperature of an object when it receives microwave power in an adiabatic state.
Figure 27:
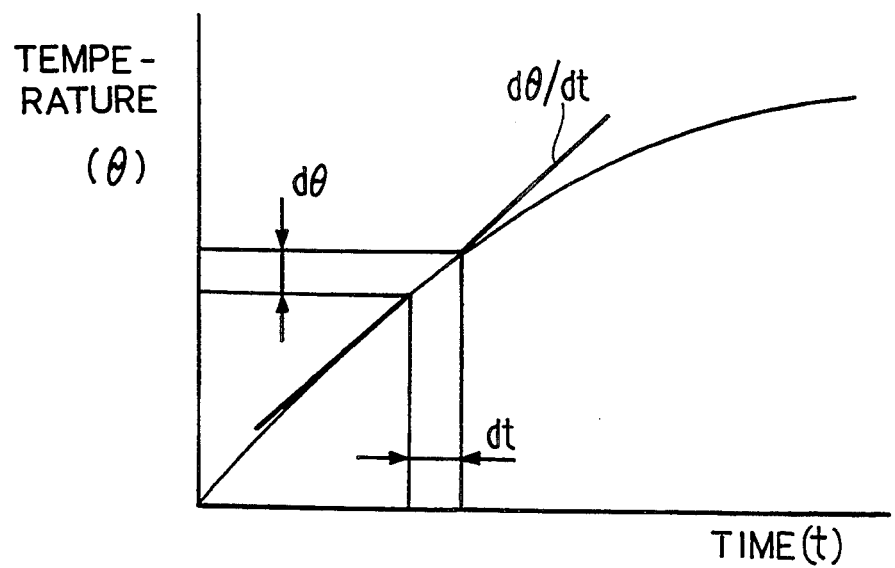
FIG. 27 is a graph showing variation of temperature of an object when it receives microwave power in a state where heat radiation occurs.
Figure 28:
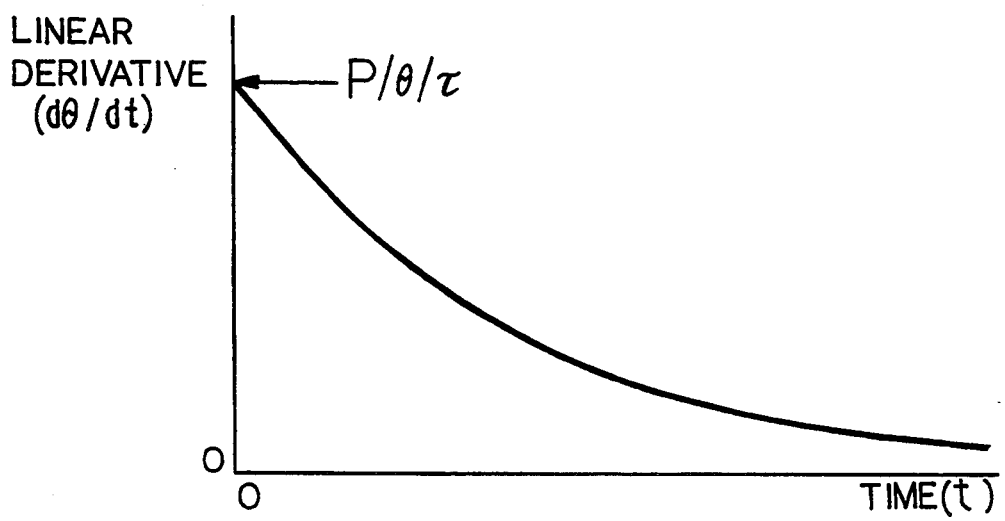
FIG. 28 is a graph showing a linear derivative of temperature with respect to time when an object receives microwave power in a state where heat radiation occurs.
Figure 29:
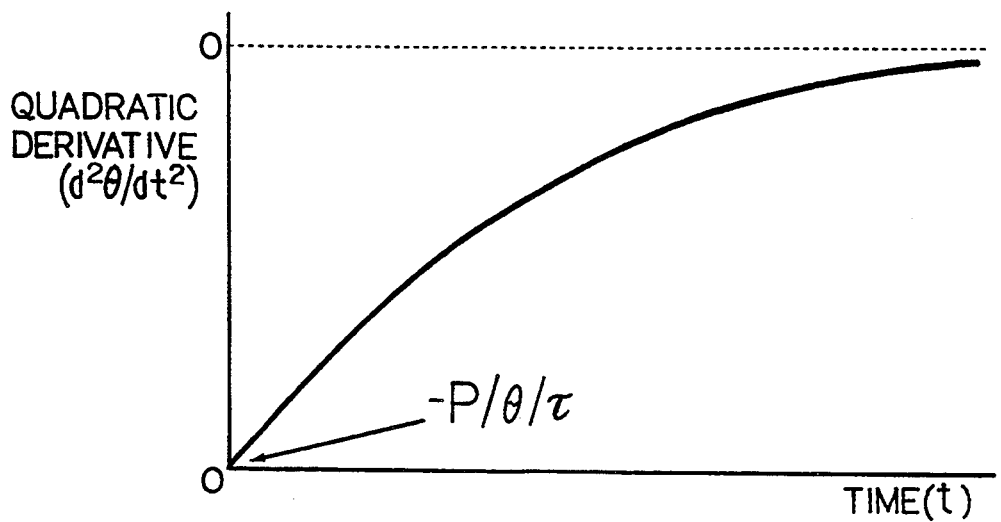
FIG. 29 is a graph showing a quadratic derivative of temperature with respect to time when an object receives microwave power in a state where heat radiation occurs.

FIG. 25 shows as an example of a bridge circuit 538 composed of a microwave sensor 10, temperature sensor 50, and resistors 536 and 537, which is used for controlling the magnetron 18 in the microwave power detecting device of the third embodiment of the invention. As shown in FIG. 25, the microwave oven is provided with a controller 30 comprising a CPU and memory. The memory stores a cooking program according to quantity of heat generation of some food being a heating object for each cooking selection switches 516c, 516d, . . . 516n on the operator panel 516. Switches 516a and 516b in addition to these switches 516c, 516d . . . , 516n are connected with the input side of the controller 30. A detecting circuit 531 to detect a heating state or finishing state of food is connected through A/D converters 533 and 534 to the input side of the controller 30.

The detecting circuit 531 is provided with the bridge circuit 538 which connects in parallel a series circuit of a resistor 536 and the microwave sensor 10 with a series circuit of a resistor 537 and the temperature sensor 50, and an amplifier 539 which connects its input terminals with the output terminals A and B of the bridge circuit 538 respectively. Resistance values of the resistors 536 and 537 are respectively 100 kΩ, the same as those of the thermistors 11 and 51. The direct current power source 541 is connected through a current control resistor 540 to the input terminals of the bridge circuit 538. The output side of the controller 30 is connected through a driver circuit 542 to the magnetron 18 and is connected through a driver circuit 543 to the motors 20 and 23.

As described above, the present invention makes it possible to accurately detect the microwave power. If the relation of the expression (1), and the heat radiation constant $\delta$ and thermal time constant $\tau$ of the microwave sensor are entered into the controller 30 in advance, and heat power caused by absorbing microwave is detected by the microwave sensor made to consider the heat radiation of the microwave sensor with the $\Gamma$ and $\tau$, then it is not necessary for the microwave sensor to be provided with a heat insulating member to prevent heat radiation.

Since the computing device computes microwave power with the lapse of time, if output of the microwave course is controlled on the basis of variation of the microwave power, then the heated object can be accurately processed in a desired thawing or heating state.

While the foregoing description and drawings represent the preferred embodiments of the present invention, it will be obvious to those skilled in the art that various changes and modifications may be made therein without departing from the true spirit and scope of the present invention.

What is claimed is:

1. A microwave oven comprising:
   a wall defining a microwave chamber;
   a microwave energy source for supplying microwave energy to the chamber;
   a microwave sensor comprising:
      a wave absorber for generating heat through absorption of microwave energy; and
      a first thermistor for detecting the temperature of said absorber, said first thermistor having a temperature sensing part positioned adjacent to said wave absorber and positioned to avoid microwave energy from the microwave energy source;
   a temperature sensor comprising a second thermistor for detecting the ambient temperature immediate said wave absorber; and computing means for computing microwave power as a function of time, according to the expression:

$$P = C \cdot d\Theta/dt + \delta \cdot \Theta;$$

where P represents microwave power absorbed by the wave absorber, $\Theta = \Theta_1 - \Theta_2$, where $\Theta_1$ represents temperature rise detected by the first thermistor and $\Theta_2$ represents temperature rise detected by the second thermistor, C represents heat capacity of the microwave sensor, and $\delta$ represents a thermal radiation constant of the microwave sensor.

2. The microwave oven as defined in claim 1, wherein said temperature sensor has the same shape, size, and heat capacity as said wave absorber and has a wave reflector which reflects microwave energy, and wherein said second thermistor detects the temperature of said wave reflector and has the same construction as said first thermistor.

3. The microwave oven as defined in claim 2, wherein the wave reflector is provided with a second wave absorber having the same construction as said first wave absorber, and a metal coating to reflect microwave energy provided on a face to receive microwave energy of said second wave absorber.

4. The microwave oven as defined in claim 1, wherein said wave absorber is formed in the shape of a flat plate having at least a wider area than a temperature sensing part of the thermistor, one face of said wave absorber being a microwave absorbing face, and wherein said temperature sensing part of the thermistor is adhered to another face of said wave absorber so that said thermistor may avoid microwave energy from a microwave energy source.

5. The microwave oven as in claim 1, wherein said microwave sensor is provided with a metal cover which covers said thermistor together with its leads in close vicinity of said thermistor, and wherein said wave absorber is formed in a layer on said metal cover.

6. The microwave oven as defined in claim 1, wherein said wave absorber having a thermistor characteristic, and a pair of electrodes which are formed with a certain space therebetween on a face of said wave absorber not exposed to microwave energy.

7. The microwave oven as defined in claim 1, wherein said wave absorber covers said thermistor together with its leads in close vicinity of said thermistor.

8. The microwave oven as defined in claim 1, wherein the wave absorber having a front face which receives microwave energy and having a back face which does not receive microwave energy, a metal member joined to the back face of the wave absorber, and a thermistor held by said metal member, the temperature of said wave absorber being sensed through said metal member.

9. The microwave oven as defined in claim 1, wherein said wave absorber is formed in the shape of a flat plate being at least wider in area than said temperature sensing part of the first thermistor, and a first metal member holds said wave absorber so as to expose at least one face, said face being a microwave absorbing face of the absorber, and wherein the first metal member has a flange which is fixed on a part surrounding a fitting hole.

10. The microwave oven according to claim 1 wherein the wall includes a back face and the second thermistor is fitted on the back face.

11. The microwave according to claim 1 wherein the wall includes an opening, said wave absorber being fitted into the opening so that a face of the wave absorber faces into the microwave chamber.

* * * * *